United States Patent
Dahl et al.

(10) Patent No.: US 8,476,540 B2
(45) Date of Patent: Jul. 2, 2013

(54) SHELTER FOR PORTABLE ELECTRICAL INLETS/OUTLETS

(75) Inventors: Frederick Alan Dahl, Dundas, MN (US); James Jerome Koberg, Morristown, MN (US); Brian Allen Amacher, Faribault, MN (US)

(73) Assignee: Trystar, Inc., Faribault, MN (US)

( * ) Notice: Subject to any disclaimer, the term of this patent is extended or adjusted under 35 U.S.C. 154(b) by 252 days.

(21) Appl. No.: 12/967,729

(22) Filed: Dec. 14, 2010

(65) Prior Publication Data

US 2012/0145451 A1 Jun. 14, 2012

(51) Int. Cl.
*H01R 13/46* (2006.01)

(52) U.S. Cl.
USPC .............. 174/520; 174/50; 439/369; 248/906

(58) Field of Classification Search
USPC ............. 174/520, 50; 439/367, 369; 248/906; 361/600, 727
See application file for complete search history.

(56) References Cited

U.S. PATENT DOCUMENTS

| | | |
|---|---|---|
| 2,205,969 A | 6/1940 | Boenecke |
| 2,732,581 A | 1/1956 | Heck |
| 2,960,254 A | 11/1960 | Kiba |
| 3,055,534 A | 9/1962 | Boenecke |
| 3,086,676 A | 4/1963 | Dilatush |
| 3,087,192 A | 4/1963 | Hertzke |
| 3,144,506 A | 8/1964 | Gunthel, Jr. |
| 3,333,726 A | 8/1967 | Belanger |
| 4,229,616 A | 10/1980 | Hotchkiss |
| 4,382,649 A | 5/1983 | Meyer |
| D284,465 S | 7/1986 | Epley |
| 4,702,541 A | 10/1987 | Arnold |
| 4,848,574 A | 7/1989 | Murphy et al. |
| 5,211,302 A | 5/1993 | Tiramani |
| 5,217,387 A | 6/1993 | Hull et al. |
| 5,357,565 A | 10/1994 | Butler, III et al. |
| 5,529,205 A | 6/1996 | Corney et al. |
| 5,551,888 A | 9/1996 | Rhodes, Sr. |
| 5,562,208 A | 10/1996 | Hasler et al. |
| 5,887,744 A | 3/1999 | Mejias |
| 5,938,063 A | 8/1999 | Hoftman |
| 6,000,550 A | 12/1999 | Simpson et al. |
| 6,099,340 A | 8/2000 | Florentine |
| 6,250,946 B1 | 6/2001 | Tardy |
| 6,265,665 B1 | 7/2001 | Zahnen |
| D481,361 S | 10/2003 | Barnes |
| D499,330 S | 12/2004 | Peato |
| 7,141,738 B2 | 11/2006 | Marsac et al. |
| 7,273,984 B2 | 9/2007 | Murphy |
| 7,285,725 B1 | 10/2007 | Saman |
| 7,513,760 B2 | 4/2009 | Keeven et al. |
| 7,553,181 B1 | 6/2009 | Van Dalinda, III |

*Primary Examiner* — Dhirubhai R Patel
(74) *Attorney, Agent, or Firm* — Fredrikson & Byron, P.A.

(57) ABSTRACT

A shelter for protecting a portable electrical inlet/outlet (PEIO) includes a base and a cover. In some examples, the base includes a platform to support a body of the PEIO, and the platform is configured to segregate the PEIO body from water that may accumulate. In some examples, the cover configured to mate with the base to substantially enclose the platform. Upon being inserted into the shelter, the PEIO may be protected from unwanted elements, such as rain, snow, unintended contact by humans or animals, or the like.

28 Claims, 14 Drawing Sheets

SHELTER FOR PORTABLE ELECTRICAL INLETS/OUTLETS

TECHNICAL FIELD

This disclosure relates to electrical connectors and, more particularly, to shelters for electrical connectors.

BACKGROUND

Portable electrical inlets/outlets ("PEIO") are used in many settings in which access to electricity must be provided on a temporary basis. Examples of such settings include trade shows, concerts, and other similar events. During operation, a PEIO may supply electrical power from a readily available power source, such as a permanently mounted wall socket or a portable power generator, to one or more pieces of electrical equipment. For example, common types of PEIOs include extensions cords, power strips, and outlet splitters. An example of another type of PEIO used in some applications is a quad box. A quad box generally includes a power inlet cable, a power outlet cable, and one or more connectors for connecting electrical equipment to the quad box. In some applications, the power outlet cable of one quad box may function as the power inlet cable of another quad box to create a distributed power network.

PEIOs are often used in public settings, such as outdoor settings subject to inclement weather. Accordingly, a PEIO may be exposed to standing water, inclement weather, ground debris, kicking, and other deliberate or inadvertent physical contact during operation. Ensuring that a PEIO is kept clean, dry, and free from contact by people or animals may be useful for the safe and intended operation of a PEIO.

Prior attempts at sheltering PEIOs have been made. Examples can be found in the teaching of U.S. Pat. Nos. 6,250,946 and 4,702,541, and U.S. Design Pat. No. 284,465. Such attempts have been inadequate at suitably protecting PEIOs for a variety of reasons. Additionally, PEIOs that operate in an outdoor environment are often wrapped in a plastic bag (e.g., a garbage bag) that is taped in an attempt to protect the PEIOs from unwanted outdoor elements. This method of protection is not particularly effective nor is it especially aesthetically pleasing in a public setting.

SUMMARY

The disclosure is directed toward shelters for protecting PEIOs from unwanted elements such as, e.g., moisture, debris, and contact by people or animals. In some examples, the shelters protect a PEIO by physically encasing the PEIO in a material resistant to physical and environmental elements. In some additional examples, the shelters include legs, a stand, or other features that elevate the shelter (and hence a PEIO positioned in the shelter) above a surface on which the PEIO is set. These elevating features can protect the PEIO from water should water accumulate on the surface on which the shelter is set. In the event that water enters a shelter, the shelter may include features to segregate the PEIO from water that accumulated inside the shelter. For example, the shelter may include features that elevate the PEIO above a floor of the shelter so that water passes around or under the PEIO without substantially contacting the water. As another example, the shelter may include a drain hole to drain accumulated water out of the shelter. The shelter may include additional or different features, as described herein.

In accordance with one example described herein, a shelter for protecting a PEIO from unwanted elements, where the PEIO includes a PEIO body, first and second PEIO cables, and at least two PEIO-component connectors is described. The shelter includes a base that includes a platform to support the PEIO body and at least one sidewall. The platform includes a main area and a raised rib structure configured to segregate the PEIO body from water that may accumulate in the main area. The at least one sidewall extends substantially around at least a portion of a perimeter of the platform. The shelter also includes a cover that is configured to mate with the base to substantially enclose the platform. According to the example, the shelter defines at least two PEIO-component-connector-cable holes configured to permit component cables to extend from an exterior of the shelter to the at least two PEIO-component connectors within the shelter. The shelter also defines a first PEIO-cable hole and a second PEIO-cable hole, the first and second PEIO-cable holes being configured to permit the first and second PEIO cables to extend from the PEIO body within the shelter to an exterior of the shelter.

In another example, a system includes a PEIO, a shelter, and a component cable. The PEIO includes a PEIO body, a first PEIO cable, a second PEIO cable, and at least two PEIO-component connectors. The shelter includes a base that includes a platform to support the PEIO body and at least one sidewall. The platform includes a main area and a raised rib structure that is configured to segregate the PEIO body from water that may accumulate in the main area. The at least one sidewall extends substantially around at least a portion of a perimeter of the platform. The shelter also includes a cover configured to mate with the base to substantially enclose the platform. The shelter defines a first PEIO-cable hole, a second PEIO-cable hole, and at least two PEIO-component-connector-cable holes. According to the example, the PEIO is positioned such that the PEIO body is adjacent the raised rib structure of the shelter, the first PEIO cable extends from the PEIO body through the first PEIO-cable hole to an exterior of the shelter, the second PEIO cable extends from the PEIO body through the second PEIO-cable hole to the exterior of the shelter, and the component cable extends from one of the at least two PEIO-component connectors through one of the at least two PEIO-component-connector-cable holes to the exterior of the shelter.

In another example, a method is described that includes providing a shelter that includes a base and a cover. The base includes a platform to support the PEIO body, the platform including a main area and a raised rib structure configured to segregate the PEIO body from water that may accumulate in the main area, and at least one sidewall extending substantially around at least a portion of a perimeter of the platform. The shelter also includes a first PEIO-cable hole, a second PEIO-cable hole, and at least two PEIO-component-connector-cable holes. According to the example, the method includes inserting a PEIO that includes a PEIO body, a first PEIO cable, a second PEIO cable, and at least two PEIO-component connectors into the shelter, and mating the cover of the shelter to the base of the shelter to substantially enclose the PEIO body within the shelter.

The details of one or more examples are set forth in the accompanying drawings and the description below. Other features, objects, and advantages will be apparent from the description and drawings, and from the claims.

BRIEF DESCRIPTION OF DRAWINGS

The following drawings are illustrative of particular examples of the present disclosure and therefore do not limit the scope of the disclosure. The drawings are not to scale (unless so stated) and are intended for use in conjunction with the explanations in the following detailed description. Examples will hereinafter be described in conjunction with the appended drawings, wherein like numerals denote like elements.

DETAILED DESCRIPTION

The following detailed description is exemplary in nature and is not intended to limit the scope, applicability, or configuration of the invention in any way. Rather, the following description provides practical illustrations for implementing exemplary embodiments of the present invention. Examples of constructions, materials, dimensions, and manufacturing processes are provided for selected elements, and all other elements employ that which is known to those of skill in the field of the invention. Those skilled in the art will recognize that many of the examples provided have suitable alternatives that can be utilized.

PEIOs can distribute power from a readily available power source, such as a permanently mounted wall socket or a portable power generator, to one or more pieces of electrical equipment. For example, a PEIO may include a connector for electrically connecting to a power source as well as one or more component connectors (e.g., plug receptacles) to which electrical equipment can be electrically connected. Because a PEIO can be used for power distribution, PEIOs are often used at public events, such as trade shows, concerts, and other similar events. Depending on the type of event, a PEIO may be used in an outdoor setting. Accordingly, a PEIO may be exposed to standing water, inclement weather, ground debris, kicking, scratching, and other inadvertent physical contact during operation.

This disclosure describes a shelter for a PEIO. The shelter may protect the PEIO from unwanted elements such as, e.g., debris and unintended contact by people or animals. The shelter may also protect the PEIO from moisture that could otherwise create a short circuit. For instance, in one example, the PEIO includes a platform that includes a raised rib structure that is capable of segregating the PEIO from water that may accumulate in a main area of the platform. In another example, the PEIO includes an elevating portion that extends downwardly from a platform and that is capable of elevating the platform from a surface on which the shelter is set. Upon inserting the PEIO into the shelter, the elevating portion can elevate the PEIO above a surface. Should water accumulate on the surface on which the shelter and the PEIO is positioned, the elevating portion may prevent the PEIO from being exposed to water.

In an additional example, the shelter includes a cover that can be mated with a base to substantially enclose a platform that supports the PEIO. Depending on the configuration of the shelter, the shelter may substantially enclose the PEIO within a confined space that is bounded on all sides by the shelter. In such a configuration, the shelter may help protect the PEIO from inadvertent physical contact, such as being kicked, being stepped on, or the like.

Different views of an example shelter will be described in greater detail with reference to FIGS. 2-6. However, an example PEIO and an example shelter will first be described with reference to FIG. 1.

Figure 1:
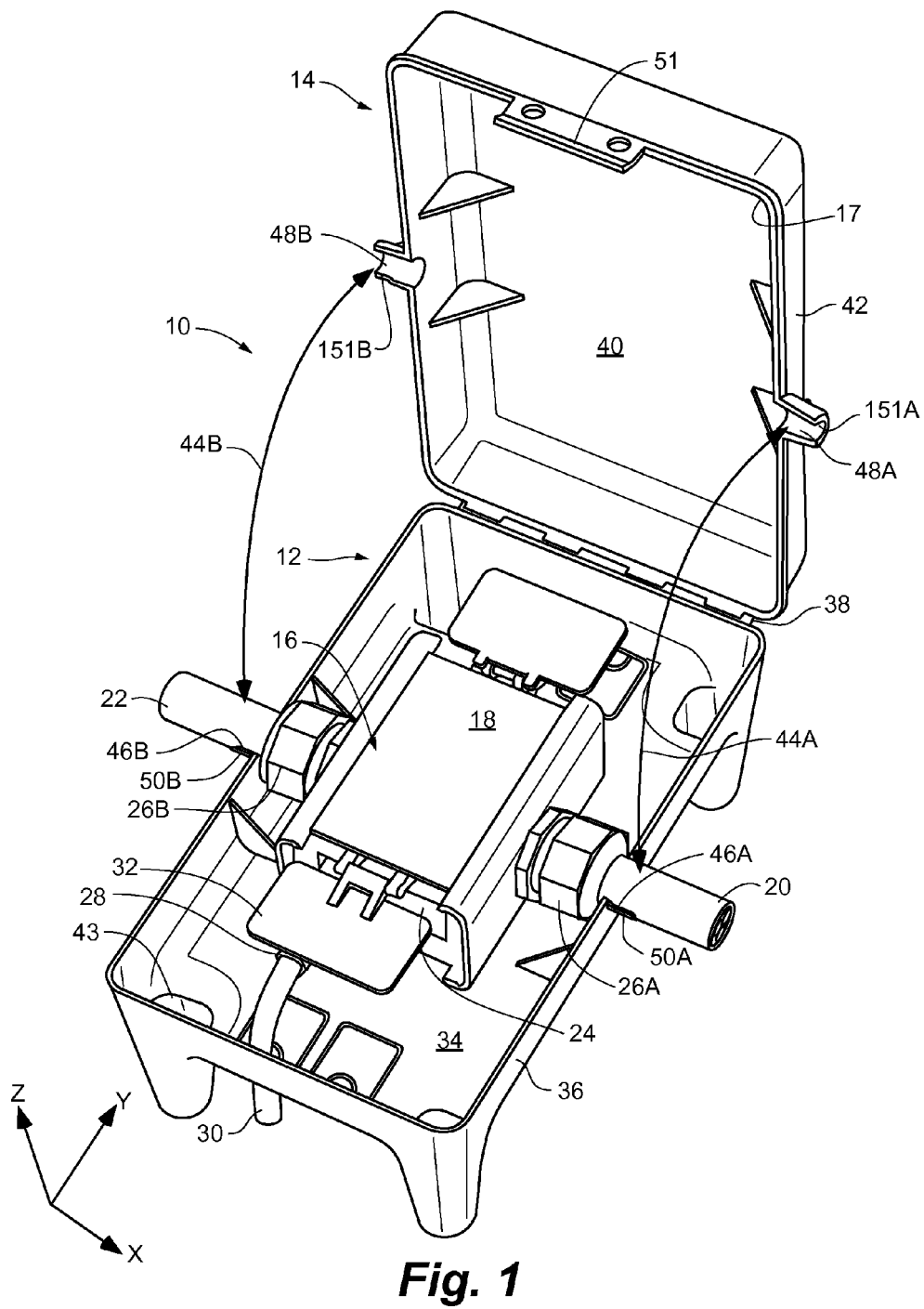
FIG. 1 is a perspective view of an example portable electrical inlet/outlet and an example shelter configured to receive the portable electrical inlet/outlet in accordance with examples of the present disclosure.

FIG. 1 is conceptual view of an example shelter 10 in accordance with this disclosure. Shelter 10 includes base 12 and cover 14. Base 12 is configured to support PEIO 16. PEIO 16 can be positioned onto base 12, and cover 14 can be positioned over base 12 to substantially encase PEIO 16 within shelter 10. Shelter 10 may help protect PEIO 16 from a variety of unwanted elements including, e.g., unintended contact by people or animals, and inclement weather. For example, as described in greater detail below, shelter 10 may include features that help protect PEIO 16 from moisture that may otherwise short circuit PEIO 16. In one example, shelter 10 includes a rib structure (FIG. 2) that is configured to segregate PEIO 16 from water that may accumulate in a main area of base 12. In another example, PEIO includes an elevating portion (FIGS. 1 and 2) that extends downwardly and that is configured to elevate base 12 from a surface on which shelter 10 is set. Shelter 10 may include additional or different features, as described below.

Shelter 10 is configured to support PEIO 16. In general, PEIO 16 may be any device that includes a power inlet that is configured to electrically connect with a power source, and a power outlet that is configured to electrically connect with an electrical component. In the example of FIG. 1, PEIO 16 is generally illustrated in the style of a quad box. A quad box may be a junction box that electrically connects at least one electrical inlet to a plurality of different electrical outlets (e.g., two, three, four or more electrical outlets). In some examples, a quad box may include a plurality of modular PEIO-component connectors (described in greater detail below), each of which may be replaced, e.g., to repair or reconfigure the quad box.

Because PEIO 16 is generally illustrated in the style of a quad box in FIG. 1, the remainder of the present disclosure generally refers to an example configuration of shelter 10 that is designed to receive a quad box. However, other configurations of shelter 10 are possible in accordance with the present disclosure and it should be appreciated that the disclosure is not limited to any particular type of PEIO. For example, PEIO 16 may be an extension cord, a power strip, or an outlet splitter, each of which can include a power inlet (e.g., male connector) and one or more power outlets (e.g., female connector).

In the example of FIG. 1, which generally depicts a quad box-style PEIO, PEIO 16 includes a PEIO body 18, a first PEIO cable 20, a second PEIO cable 22, and at least one PEIO-component connector 24, which in the example of FIG. 1 is illustrated as four PEIO-component connectors (collectively "connectors 24," only one of which is labeled for clarity). First PEIO cable 20 electrically connects PEIO body 18 to a power source such as, e.g., a permanently mounted wall socket or a portable power generator. First PEIO cable 20 may directly connect PEIO body 18 to a power source (e.g., without any intervening components) or indirectly connect PEIO body 18 to a power source (e.g., through another PEIO body). Second PEIO cable 22 electrically connects PEIO body 18 to another PEIO body (not illustrated) to create an in-line series of PEIO boxes connected to a common power source. Depending on the configuration of PEIO 16, first PEIO cable 20 and second PEIO cable 22 may each be permanently attached to PEIO body 18, or one or both of first PEIO cable 20 and second PEIO cable 22 may be detachable from PEIO body 18. For example, as seen in FIG. 1, first PEIO cable 20 and second PEIO cable 22 may be detachably connected to PEIO body 18 via threaded connectors 26A and 26B, respectively, although any suitable mechanical fixation element (e.g., clasp, bolt, screw) may be used to detachably connect first PEIO cable 20 and second PEIO cable 22 to PEIO body 18. For instance, PEIO body 18 may include male electrical connectors (e.g., two or three-prong electrical connectors) and first PEIO cable 20 and/or second PEIO cable 22 may include corresponding female electrical connectors which can be friction fit over the male connectors of PEIO body 18.

First PEIO cable 20 and second PEIO cable 22 can have any suitable dimensions and can be configured to carry any suitable amount and type of electricity. In different examples, first PEIO cable 20 and second PEIO cable 22 can carry single-phase alternating current (AC), three-phase AC, or direct current (DC). In some examples, first PEIO cable 20 and second PEIO cable 22 are each capable of electrically conveying at least conventional 110 volt/120 volt electricity from a standard wall socket. In some additional examples, first PEIO cable 20 and second PEIO cable 22 are each capable of electrically conveying higher voltages such as, e.g., 220 volt single-phase AC current, or 208 volt three-phase current. In yet additional examples, first PEIO cable 20 and second PEIO cable 22 are each configured to electrically convey less than or equal to approximately 600 volts.

PEIO 16 also includes PEIO-component connectors 24. Each component connector of PEIO-component connectors 24 is capable of electrically connecting to a component that operates on electrical energy. For instance, in the example of FIG. 1, each component connector of PEIO-component connectors 24 is a port defined by PEIO body 18 (e.g., a female connector) that is configured to receive a corresponding plug 28 (e.g., male connector) disposed at a distal end of a component cable 30. In some examples, each component connector of PEIO-component connectors 24 may be designed to receive a multi-prong plug such as, e.g., a two or three-prong electrical plug found on some standard extension cords, or a four or five-prong electrical plug found in some commercial applications. Each component connector of PEIO-component connectors 24 may be the same as each other component connector of PEIO-component connectors 24, or at least one component connector of PEIO-component connectors 24 may be different than at least one other component connector of PEIO-component connectors 24. For example, as noted above, PEIO 16 may include modular PEIO-component connectors that can be reconfigured, e.g., by replacing one style of PEIO-component connector with a different style of PEIO-component connector. Other configurations of PEIO-component connectors 24 are contemplated, however, and any suitable PEIO-component connector may be used in accordance with the disclosure. For instance, in another example, each connector of PEIO-component connectors 24 may be a protruding connection extending from PEIO body 18 (e.g., a male connector configured to receive a corresponding female connector).

In the example of FIG. 1, PEIO 16 includes four PEIO-component connectors 24. Specifically, PEIO 16 includes two, outwardly-facing, side-by-side PEIO-component connectors arranged on one side of PEIO body 18 and two different, outwardly-facing, side-by-side PEIO component connectors arranged on an opposing side of PEIO body 18. As a result, PEIO 16 provides two sets of oppositely facing PEIO-component connectors. The number, type, and arrangement of PEIO-component connectors 24 may vary, e.g., based on the type of electrical components that PEIO 16 is intended to supply power for. For example, PEIO 16 may include fewer PEIO-component connectors (e.g., one or two), more PEIO-component connectors (e.g., five or more), or a different physical arrangement of PEIO-component connectors than illustrated in FIG. 1.

As seen in the example FIG. 1, in some applications, each PEIO-component connector or each set of PEIO-component connectors of PEIO 16 may include a cover 32 that rotates relative to PEIO body 18. Such cover 32 may protect each PEIO-component connector from dirt, debris, or the like when plug 28 is not inserted into the component connector.

Each PEIO-component connector of PEIO 16 may be electrically connected to a component cable, such as component cable 30. In general, component cable 30 is an electrically conductive cable that includes an electrically insulative exterior. Depending on the configuration of PEIO 16, component cable 30 may be a standard extension cord that plugs in to PEIO body 18 at one of PEIO-component connectors 24 and that extends to a component that operates on electrical energy, or component cable 30 may be non-standard cable that is capable of conducting electrical energy.

In operation, PEIO 16 can distribute power from a power supply to one or more electrically connected components. In one example, power enters PEIO body 18 via first PEIO cable 20 and is split between each PEIO-component connectors of PEIO-component connectors 24 and second PEIO cable 22. In such an example, PEIO body 18 may house various hardware to, e.g., split, step-up, and/or step-down the electricity entering PEIO body 18. In another example, first PEIO cable 20 encases electrically isolated wires that are separately electrically connected to each of PEIO-component connectors 24 and second PEIO cable 22. PEIO 16 may have other configurations as well.

To help protect PEIO 16 from unwanted elements, PEIO 16 may be positioned in shelter 10 in accordance with this disclosure. Shelter 10 can assume different configurations; however, in the example of FIG. 1, shelter 10 includes base 12 and cover 14. Base 12 includes platform 34 and sidewall 36. Platform 34 provides physical support for PEIO body 18 when PEIO 16 is inserted into shelter 10. Sidewall 36 extends substantially around the perimeter of platform 34 to define a cavity that is configured to receive PEIO 16. Cover 14 is configured to mate with base 12 to substantially enclose platform 34. Specifically, in the example of FIG. 1, cover 14 is pivotally mounted to base 12 via hinge 38 and is configured to mate with an upper surface of sidewall 36. Although in other examples, cover 14 may not be affixed to base 12 (e.g., via hinge 38) but can instead be simply placed on top of base 12. In FIG. 1, PEIO 16 can be inserted into base 12, and cover 14 can close over PEIO body 18 to help protect PEIO body 18 within a bounded cavity defined by platform 34, sidewall 36, and cover 14. By positioning PEIO body 18 between base 12 and cover 14, shelter 10 may provide protection to substantially the entire PEIO body, e.g., to prevent damage from dropping, scratches, or other physical abuse. Further, as will be described in greater detail with respect to FIG. 2, shelter 10 may include various features to help prevent PEIO body 18 from being exposed to moisture during operation.

As shown in FIG. 1, shelter 10 receives PEIO 16 by positioning PEIO body 18 on platform 34. Platform 34 physically supports PEIO body 18 within shelter 10. Platform 34 may define any suitable size and shape, and the size and shape of platform 34 may vary, e.g., based on the size and shape of PEIO body 18. For example, platform 34 may define a planar surface or a non-planar surface, as described in greater detail below with respect to FIG. 2. In some examples, PEIO 16 mechanically attaches to platform 34, e.g., by mechanically attaching a bottom surface of PEIO body 18 to platform 34. For instance, a mechanical fixation element such as, e.g., bolts, screws, adhesive, or the like may be used to mechanically attach PEIO 16 to platform 34. In other examples, PEIO 16 is supported on platform 34 without being mechanically affixed to platform 34. For instance, in the example shown in FIG. 1, PEIO 16 is positioned on platform 34 and cover 14 may rotate closed over PEIO 16 to friction fit PEIO 16 between base 12 and cover 14. Such an arrangement may prevent PEIO 16 from moving out of alignment with base 12 after PEIO 16 is positioned within shelter 10.

In the example of FIG. 1, base 12 includes at least one sidewall 36, which is illustrated as four interconnected sidewalls that surround a substantially rectangular-shaped platform 34. Sidewall 36 extends upwardly (i.e., in the Z-direction indicated on FIG. 1) from platform 34. Sidewall 36 may help protect the sides of PEIO body 18 from unintended contact and may also define a surface that can mate with cover 14. In some examples, as illustrated in FIG. 1, sidewall 36 extends around substantially the entire perimeter of platform 34 (i.e., in the X-Y plane indicated on FIG. 1). In other examples, sidewall 36 extends around less than the entire perimeter of platform 34. For example, base 12 may include a plurality of discrete sidewall segments that are physically separated from one another around platform 34. In yet other examples, base 12 may not include sidewall 36. In such an example, PEIO 16 may be positioned on platform 34 and cover 14 may be configured (e.g., sized and shaped) with a cavity that may be arranged over PEIO 16 such that cover 14 mates with base 12 around a perimeter of platform 34.

While base 12 is illustrated as defining a substantially rectangular shape, in other examples base 12 can define other shapes. Base 12 can define any polygonal (e.g., square, hexagonal) or arcuate (e.g., circular, elliptical) shape, or even combinations of polygonal and arcuate shapes. The specific shape of base 12 may vary, e.g., based on the specific shape of PEIO 16.

In operation, base 12 of shelter 10 may be placed on a surface that is exposed to unwanted elements from above (i.e., in the Z-direction indicated on FIG. 1) such as, e.g., rain, snow, or inadvertent contact. For this reason, shelter 10 may include a cover that mates with base 12 to help protect PEIO 16 from above. Shelter 10 may include any suitable cover including, e.g., a cover that mates with base 12 such that there is substantially no separation gap between the cover and base 12. Such a cover may prevent unwanted elements from entering shelter 10 from the sides of the shelter (i.e., in the X-Y plane).

In the example of FIG. 1, cover 14 includes top surface 40 and at least one cover-sidewall 42, which is illustrated as four interconnected cover-sidewalls that surround a substantially rectangular-shaped top surface. Cover-sidewall 42 extends downwardly (i.e., in the Z-direction indicated on FIG. 1) from top surface 40. Top surface 40 may be planar as illustrated in FIG. 1 or non-planar (e.g., domed, peaked, or the like). A non-planar top surface 40 may help repel unwanted elements from top surface 40 and may help prevent water or debris from collecting on top surface 40.

As with sidewall 36 of base 12, cover-sidewall 42 may help protect the sides of PEIO body 18 from unintended contact when PEIO 16 is inserted into shelter 10. In some examples, as illustrated in FIG. 1, cover-sidewall 42 extends around substantially the entire perimeter of top surface 40 (i.e., in the X-Y plane indicated on FIG. 1). Cover 14 may define a size and shape that substantially corresponds to a size and shape of base 12. In such an example, cover 14 may mate with base 12 when an edge of cover-sidewall 42 is positioned adjacent an edge of sidewall 36 of base 12. In other examples, cover 14 does not include cover-sidewall 42. For example, cover 14 may instead be a planar sheet. In such an example, top surface 40 of cover 14 may be positioned directly adjacent base 12 to encase PEIO 16 within shelter 10.

In some examples, cover 14 may include a lip that extends over an edge of base 12 when cover 14 is mated to base 12. For instance, in the example of FIG. 1, cover 14 includes lip 17 (also illustrated in FIG. 2) that extends around a perimeter of cover-sidewall 42 and that projects outward (i.e., in the X and Y-directions) and downward (i.e., in the Z-direction) from a bottom edge of cover-sidewall 42. When cover 14 is mated with base 12, lip 17 extends down over sidewall 36 of base 12 so that any rain that falls on cover 14 flows off cover-sidewall 42 without entering shelter 10 at the junction between cover 14 and base 12.

As discussed above with respect to base 12, cover 14 can define shapes other than the substantially rectangular shape illustrated in FIG. 1. For example, cover 14 can define any polygonal (e.g., square, hexagonal) or arcuate (e.g., circular, elliptical) shape, or even combinations of polygonal and arcuate shapes. The specific shape of cover 14 may vary, e.g., based on the specific shape of PEIO 16 and/or the specific shape of base 12.

The specific dimensions of shelter 10 may vary, e.g., based on the specific dimensions of PEIO 16. That being said, in some examples, shelter 10 may include cover 14 that is between approximately 25 centimeters and approximately 45 centimeters long (i.e., in the Y-direction), such as approximately 35 centimeters, between approximately 16 centimeters and approximately 36 centimeters wide (i.e., in the X-direction), such as approximately 26.5 centimeters, and between approximately 1 centimeter and approximately 10 centimeters tall (i.e., in the Z-direction), such as approximately 4.5 centimeters. In some examples, shelter 10 may include base 12 that is between approximately 25 centimeters and approximately 45 centimeters long (i.e., in the Y-direction), such as approximately 35 centimeters, between approximately 16 centimeters and approximately 36 centimeters wide (i.e., in the X-direction), such as approximately 26.5 centimeters, and between approximately 1 centimeter and approximately 25 centimeters tall (i.e., in the Z-direction), such as approximately 11.5 centimeters. These dimensions are merely examples, however, and other dimensions are both contemplated and possible.

Shelter 10 may be subject to different physical abuses during the service life of the shelter. At various times, shelter 10 may be dropped, kicked, scratched, abraded, or otherwise abused. Shelter 10 may protect PEIO 16 from these and other physical abuses. As such, shelter 10 may be constructed of a robust material able to withstand different physical forces without breaking. In various examples, shelter 10 may be constructed of a metal material (e.g., steel, aluminum, copper), a thermoplastic material (e.g., polystyrene, polyethylene, polypropylene, polyvinyl-based materials), a thermosetting plastic material (e.g., Bakelite, epoxy resin-based materials), or the like. In one example, shelter 10 is constructed of polypropylene, which may remain flexible and which may be substantially resistant to UV-radiation in outdoor applications. Other materials for shelter 10 are both possible and contemplated.

As described above, PEIO 16 includes first PEIO cable 20 and second PEIO cable 22. When PEIO body 18 is positioned within shelter 10, first PEIO cable 20 and second PEIO cable 22 may electrically connect PEIO body 18 to components located outside of shelter 10. For this reason, shelter 10 may include one or more apertures that define openings for physically and/or electrically connecting PEIO body 18 to features located outside of shelter 10. The number and arrangement of the different apertures may vary, e.g., based on the specific configuration of shelter 10 and the specific configuration of PEIO 16. However, with respect to the example of FIG. 1, shelter 10 defines a first PEIO-cable hole 44A and a second PEIO-cable hole 44B (which in FIG. 1 are denoted by labeled double-headed arrows, indicating that first PEIO-cable hole 44A and second PEIO-cable hole 44B are defined when cover 14 is mated to base 12). First PEIO-cable hole 44A is configured (e.g., sized and shaped) to permit first PEIO cable 20 to extend from PEIO body 18 to an exterior of shelter 10, while second PEIO-cable hole 44B is configured (e.g., sized and shaped) to permit second PEIO cable 22 to extend from PEIO body 18 to an exterior of shelter 10.

First PEIO-cable hole 44A and second PEIO-cable hole 44B can be arranged at any suitable location on shelter 10. In different examples, first PEIO-cable hole 44A and/or second PEIO-cable hole 44B may be defined entirely by base 12 of shelter 10, entirely by cover 14 of shelter 10, or in yet another location of shelter 10. For instance, in the example of FIG. 1, first PEIO-cable hole 44A and second PEIO-cable hole 44B are located at an interface between base 12 and cover 14. Specifically, base 12 defines a first base-PEIO-cable partial-hole 46A and a second base-PEIO-cable partial-hole 46B, which are lesser portions of first PEIO-cable hole 44A and second PEIO-cable hole 44B, respectively. Cover 14 defines a first cover-PEIO-cable partial-hole 48A and a second cover-PEIO-cable partial hole 48B that correspond to first base-PEIO-cable partial-hole 46A and second base-PEIO-cable partial-hole 46B, respectively. First cover-PEIO-cable partial-hole 48A and second cover-PEIO-cable partial hole 48B are lesser portions of first PEIO-cable hole 44A and second PEIO-cable hole 44B, respectively. When cover 14 is mated with base 12 (e.g., brought into adjacent alignment) first base-PEIO-cable partial hole 46A aligns with first cover-PEIO-cable partial hole 48A to create first PEIO-cable hole 44A, while second base-PEIO-cable partial hole 46B aligns with second cover-PEIO-cable partial hole 48B to create second PEIO-cable hole 44B. With this arrangement, first PEIO cable 20 and second PEIO cable 22 can extend from PEIO body 18 to an exterior of shelter 10 through first PEIO-cable holes 44A and 44B, respectively. Moreover, first PEIO cable 20 and second PEIO cable 22 may be friction fit between base 12 and cover 14 in such an arrangement, which may prevent PEIO 16 from moving out of alignment with respect to base 12 after PEIO 16 is positioned within shelter 10.

Shelter 10 can define a first PEIO-cable hole 44A and a second PEIO-cable hole 44B of any suitable size and shape. In some examples, as described in greater detail with reference to FIGS. 3A and 3B, shelter 10 can define a first PEIO-cable hole 44A and/or a second PEIO-cable hole 44B that is adjustable to accommodate PEIOs with different size cables. An adjustable cable hole may provide a tighter fit between a cable and shelter 10 than a non-adjustable cable hole, which may reduce the ingress of unwanted elements into shelter 10 through the cable hole.

In some examples, shelter 10 includes a support surface adjacent to first PEIO-cable hole 44A and/or second PEIO-cable hole 44B that functions to support first PEIO cable 20 and/or second PEIO cable 22, respectively. FIG. 1 illustrates an example of shelter 10 that includes example support surfaces.

In the example of FIG. 1, shelter 10 includes base-PEIO-cable partial-support 50A and 50B (collectively "supports 50") that extend substantially orthogonally from sidewall 36 of base 12. Base-PEIO-cable partial-supports 50 are aligned with first and second base-PEIO-cable partial-holes 46A and 46B, respectively. First PEIO cable 20 and second PEIO cable 22 can extend through first and second base-PEIO-cable partial-holes 46A and 46B, respectively, and be supported by base-PEIO-cable partial-supports 50 in the region of base 12 adjacent sidewall 36.

When configured as shown in FIG. 1, cover 14 includes complementary cover-PEIO-cable partial-supports 151A and 151B (collectively "supports 151") that extends substantially orthogonally from cover-sidewall 42 and that are aligned with first and second cover-PEIO-cable partial-holes 48A and 48B, respectively. When cover 14 is mated with base 12, cover-PEIO-cable partial-supports 151A and 151B align with base-PEIO-cable partial-supports 50A and 50B. As a result, when first PEIO cable 20 is extended through first PEIO-cable hole 44A and second PEIO cable 22 is arranged through second PEIO-cable hole 44B, first and second PEIO cables 20 and 22 are supported in the negative Z-direction (i.e., downwardly) by base-PEIO-cable partial-support 50A and 50B and in the positive Z-direction (i.e., upwardly) by a cover-PEIO-cable partial-supports 151A and 151B. Such support may help reduce or eliminate cable chafing or cracking in the region adjacent cable connectors 26A and 26B over the service life of PEIO 16.

While shelter 10 in the example of FIG. 1 includes support surfaces on both base 12 and cover 14, it should be appreciated that in other examples according to the disclosure, a shelter may include support surfaces that extend only from base 12 or extend only from cover 14. The arrangement and location of support surfaces in these examples may be dictated by the arrangement and location of PEIO-cable holes 44A and 44B on the shelter.

Shelter 10 may include a variety of different features that may help protect PEIO 16 from unwanted elements. For instance, in some applications, PEIO 16 may be used in an outdoor environment subject to inclement weather such as rain and snow. When PEIO 16 is exposed to moisture from inclement weather, the moisture may cause short circuits that reduce the electrical integrity of PEIO 16. To reduce or eliminate water accumulation adjacent PEIO 16 in these applications, shelter 10 may include moisture management features.

Figure 2:
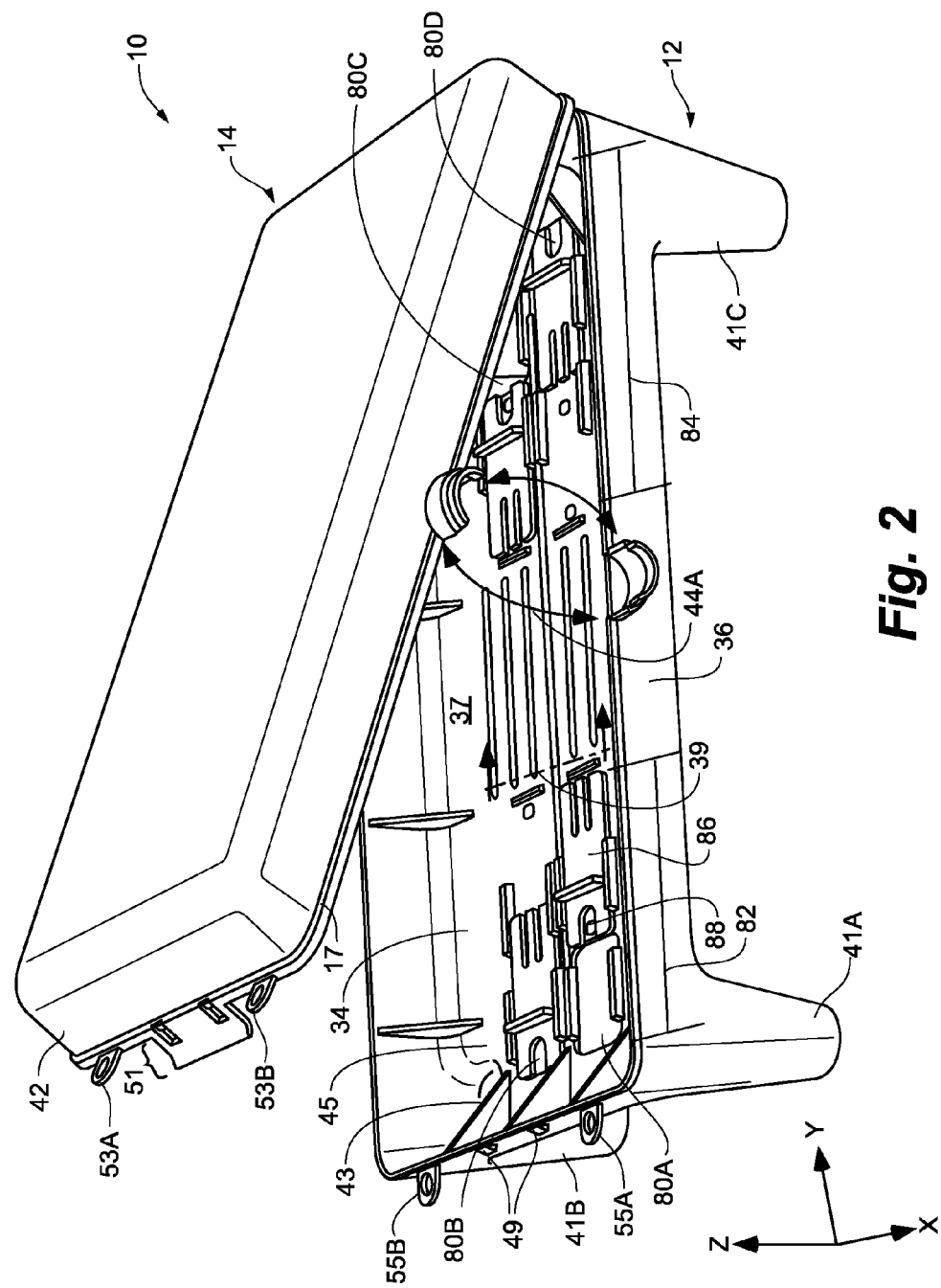
FIG. 2 is a perspective view of an example of the shelter of FIG. 1 without the portable electrical inlet/outlet.

FIG. 2 is a conceptual illustration of one example of shelter 10, generally described above with respect to FIG. 1, which includes example moisture management features. In FIG. 2, like reference numerals between FIGS. 1 and 2 refer to like elements. Further, for ease of description, PEIO 16 is not illustrated within shelter 10 in the example of FIG. 2.

In the example of FIG. 2, platform 34 of shelter 10 includes a main area 37 and a raised rib structure 39. Raised rib structure 39 may segregate PEIO 16 (FIG. 1) from moisture that may accumulate on main area 37. Raised rib structure 39 extends upwardly (i.e., in the Z-direction) from main area 37 of platform 34. Accordingly, PEIO body 18 (FIG. 1) can be positioned on raised rib structure to elevate PEIO body 18 above main area 37 of platform 34. Should water accumulate on main area 37 of shelter 10, raised rib structure 39 can segregate PEIO body 18 from the accumulated water, which may reduce or eliminate the possibility of a short circuit between PEIO body 18 and component cable 30.

Depending on the configuration of shelter 10, raised rib structure 39 may be a single rib (i.e., a single elevating feature that functions to elevate PEIO body 18 above main area 37), or a plurality of rib features. For instance, in the example of FIG. 2, raised rib structure 39 includes six ribs that are arranged in parallel alignment and that are substantially equally spaced from one another. It should be appreciated, however, that the disclosure is not limited in this respect, and other configurations of rib structure 39 are both possible and contemplated.

Independent of the specific configuration of rib structure 39, in some examples, rib structure 39 may elevate PEIO body 18 at least 2 millimeters above main area 37. When PEIO body 18 is elevated at least 2 millimeters above main area 37, the likelihood that PEIO body 18 will be immersed in water within shelter 10 may be reduced or eliminated. It should be appreciated though that rib structure 39 may elevate PEIO body 18 to heights other than 2 millimeters, and the disclosure is not limited to a rib structure that elevates a PEIO body to any particular height.

PEIO 16 may be placed on a surface that is subject to occasional standing water such as, e.g., a golf course, an outdoor concert venue, or the like. In these applications, the electrical integrity of PEIO 16 may be compromised if PEIO 16 is immersed in the standing water. For this reason, shelter 10 may include at least one elevating portion that can elevate PEIO 16 above the surface on which the shelter is placed. Should water thereafter accumulate on the surface, the elevating portion of the shelter may prevent PEIO 16 from being immersed in water.

In the example of FIG. 2, shelter 10 includes four legs 41A-41C (only three of which are labeled for clarity and which are collectively referred to as "legs 41") that function to elevate shelter 10 above a surface on which the shelter 10 is placed. Legs 41 extend downwardly (i.e., in the negative Z-direction) from platform 34 of base 12, and each leg of legs 41 is arranged adjacent a different corner of platform 34. Each leg of legs 41 is substantially the same height (i.e., in the Z-direction) such that legs 41 elevate platform 34 and maintain platform 34 in a generally parallel relationship with a surface on which shelter 10 is set.

While shelter 10 is illustrated as including four elevating legs 41, in different examples, shelter 10 may include more elevating portions (e.g., five or more legs), fewer elevating portions (e.g., three or less legs), or a different arrangement of elevating portions. For instance, in one example, shelter 10 may include three legs arranged in a tripod arrangement. In another example, shelter 10 may two legs arranged on opposing side of base 12. In yet another example, shelter 10 may include a single elevating portion centered about raised rib structure 39 and extending downwardly from platform 34. It should be appreciated that the foregoing description of elevating portions are merely examples, and the disclosure is not limited to a shelter that includes any particular number or arrangement of elevating portions. Rather, any suitable feature or combination of features that function to elevate shelter 10 above a surface on which the shelter set may be used in accordance with the disclosure.

In some examples, the at least one elevating portion of shelter 10 may be configured to support a threshold amount of weight. For example, in different configurations, the at least one elevating portion of shelter 10 may support at least 50 pounds such as, e.g., at least 100 pounds, or at least 200 pounds. In the event that someone would stand on top of shelter 10 (e.g., when cover 14 is mated with base 12), the shelter may support that person's weight without breaking.

Independent of the specific arrangement of the at least one elevating portion of shelter 10, in some examples, the at least one elevating portion of shelter 10 may elevate platform 34 at least 3 inches above a surface on which the shelter is set. When platform 34 and, correspondingly PEIO body 18, is elevated at least 3 inches above a surface on which the shelter is set, the likelihood that PEIO body 18 will be immersed in standing water on the surface may be reduced or eliminated. For example, depending on the specific configuration of shelter 10 and PEIO 16, when platform 34 is elevated at least 3 inches above a surface on which the shelter is set, electrical connects to PEIO body 18 may be elevated at least 4 inches above a surface on which the shelter is set, further increasing the separation distance between the electrical contacts and any surface water that may accumulate.

In different examples, the at least one elevating portion of shelter 10 may elevate platform 34 more than 3 inches above a surface on which the shelter is set (e.g., at least 6 inches, at least 8 inches), or less than 3 inches above a surface on which the shelter is set (e.g., approximately 1 inch, approximately 2 inches), and the disclosure is not limited in this respect. For instance, in some examples, shelter 10 includes an adjustable at least one elevating portion (e.g., adjustable legs) that can be extended to a plurality of different heights depending on the specific application for shelter 10. Alternatively, shelter 10 can be set on a separate base if additional height is desired beyond the height of a fixed-height elevating portion.

When shelter 10 is configured with sidewall 36 as shown in FIG. 2, water may accumulate within base 12. To remove water from base 12, shelter 10 may include a drain aperture that allows accumulated water to flow out of base 12. The drain aperture may be separate from any cable apertures defined in shelter 10 so that water does not flow along the length of an electrical cable when flowing out of base 12.

In some examples, shelter 10 may include a drain aperture that is defined in sidewall 36 of base 12. In other examples, shelter 10 may include a drain aperture defined in platform 34 of base 12. For example, as illustrated in FIG. 2, each leg of legs 41 defines a lumen that is connected to a drain aperture 43 (only one of which is labeled for clarity) extending through platform 34. Should any water accumulate on platform 34, the water may flow through drain aperture 43 (which is also identified on FIG. 1 for ease of reference), though a lumen defined by one of legs 41, and out the bottom of the leg and onto the surface on which shelter 10 is set. In this manner, water may exit shelter 10 without substantially contacting electrical connections between PEIO body 18 (FIG. 1) and one or more of the cables electrically connected to PEIO body 18.

In some examples, at least a portion of platform 34 may be sloped toward drain aperture 43 to preferentially direct any water that may accumulate on platform 34 out of shelter 10. For example, platform 34 may be domed or peaked adjacent raised rib structure 39 so that when PEIO body 18 is placed on raised rib structure 39, water preferentially flows away from raised rib structure 39 toward drain aperture 43. In another example, as illustrated in FIG. 2, a region 45 of platform 34 that is directly adjacent to drain aperture 43 may be sloped toward drain aperture 43. In still other examples, platform 34 can be sloped in a different configuration than as illustrated in FIG. 2. The different configurations may be dictated by the shape of shelter 10, the configuration of an elevating portion of shelter 10, or different considerations including, e.g., the shape of PEIO body 18, which may be positioned in shelter 10.

As described above with respect to FIG. 1, shelter 10 may include a variety of different apertures that define openings for physically and/or electrically connecting PEIO body 18 to features located outside of shelter 10. Further, PEIO 16 in the example of FIG. 1 includes PEIO-component connectors 24 that are configured to be electrically connected to an electrical component located outside of shelter 10. For this reason, shelter 10 may include one or more apertures that define openings to extend component cable 30 from PEIO-component connectors 24 disposed within an interior of shelter 10 to an exterior of shelter 10.

In the example of FIG. 2, shelter 10 defines at least one PEIO-component-connector-cable hole, which in FIG. 2 is illustrated as four PEIO-component-connector-cable holes 80A-D (collectively "PEIO-component-connector-cable holes 80"). The PEIO-component-connector-cable holes 80 define openings that allow component cables to extend between a PEIO body positioned within shelter 10 and an electrical component located outside of shelter 10. For instance, during setup, PEIO body 18 (FIG. 1) may be positioned on platform 34. Component cable 30 can be introduced (e.g., from either the bottom or top of base 12) through one of PEIO-component-connector-cable holes 80 and connected to one of PEIO-component connectors 24. When arranged according to this example process, component cable 30 will be connected to one of PEIO-component connectors 24 and will extend through one of PEIO-component-connector-cable holes 80 to an exterior of shelter 10.

The number, size, and arrangement of PEIO-component-connector-cable holes 80 may vary, e.g., based on the specific configuration of shelter 10 and the specific configuration of PEIO 16. With respect to the example of FIG. 2, however, PEIO-component-connector-cable holes 80 are defined in platform 34 of base 12. Specifically, two PEIO-component-connector-cable holes 80A and 80B are defined in a first portion 82 of platform 34, and two different PEIO-component-connector-cable holes 80C and 80D are defined in a second portion 84 of platform 34, where the first portion 82 of platform 34 is separated from second portion 84 of platform 34 by raised rib structure 39. Such a configuration may allow component cables to be connected to PEIO-component connectors 24 on PEIO 16 (FIG. 1), which includes two, outwardly-facing, side-by-side PEIO-component connectors arranged on one side of PEIO body 18 and two different, outwardly-facing, side-by-side PEIO component connectors arranged on an opposing side of PEIO body 18. That being said, in different examples, PEIO-component-connector-cable holes 80 may be defined within sidewall 36 of base 12, within cover 14 of shelter 10, or yet another location of shelter 10.

Shelter 10 may include one or more features to adjust the dimensions of PEIO-component-connector-cable holes 80 (e.g., to increase or decrease the diameter of the holes). In some examples, each PEIO-component-connector-cable hole 80 may be adjusted after inserting a component cable through the hole until there is substantially no separation gap between the component cable and the PEIO-component-connector-cable hole. A smaller separation gap between a PEIO-component-connector-cable hole and a component cable may decrease the likelihood that unwanted elements (e.g., rain, snow) may enter an interior of shelter 10 through the separation gap.

In the example of FIG. 2, each PEIO-component-connector-cable hole is covered by a PEIO-component-connector-cable-hole cover 86 (only one of which is labeled for clarity). In use, PEIO-component-connector-cable-hole cover 86 can move between a first position in which a PEIO-component-connector-cable hole is open and a second position in which the PEIO-component-connector-cable hole is substantially closed. For example, with reference to FIG. 2, an operator can slide PEIO-component-connector-cable-hole cover 86 in the X-Y plane to an open position, extend component cable 30 (FIG. 1) from an interior of shelter 10 to an exterior of shelter 10, and slide PEIO-component-connector-cable-hole cover 86 in an opposing direction in the X-Y plane to a substantially closed position.

In a different example, PEIO-component-connector-cable-hole cover 86 may be hingedly mounted to base 12 instead of mounted to slide between an open and a closed position. A hingedly mounted PEIO-component-connector-cable-hole cover may rotate between an open position and a substantially closed position (e.g., in the Y-Z plane) to allow component cable 30 to be extended between an interior of shelter 10 and an exterior of shelter 10. Other configurations of PEIO-component-connector-cable-hole cover 86 are possible.

Independent of the specific arrangement of PEIO-component-connector-cable-hole cover 86, PEIO-component-connector-cable-hole cover 86 may define a cutout 88 (FIG. 2) that corresponds to a size and/or shape of component cable 30. Cutout 88 may help prevent component cable 30 from being compressed when PEIO-component-connector-cable-hole cover 86 is moved to a substantially closed position. In some examples, the portion of PEIO-component-connector-cable-hole cover 86 that defines cutout 88 may be positioned over platform 34 when PEIO-component-connector-cable-hole cover 86 is closed and there is no component cable extending through the PEIO-component-connector-cable hole. For example, in FIG. 2, the portion of PEIO-component-connector-cable-hole cover 86 that defines cutout 88 may slide beyond PEIO-component-connector-cable hole 80A (i.e., to the left of the illustration in the Y-direction) when moved in a closed position. This arrangement may prevent water or debris from entering shelter 10 when PEIO-component-connector-cable-hole cover 86 is closed and there is no component cable extending through cutout 88.

Upon placing PEIO body 18 (FIG. 1) on base 12 and positioning cover 14 over base 12, it may be useful to physically connect cover 14 to base 12, e.g., to form an integral assembly that resists detachment except with user assistance. Physically attaching cover 14 to base 12 may prevent PEIO body 18 from inadvertently coming out of shelter 10 during use or transport. For instance, in the example of FIGS. 1 and 2, cover 14 of shelter 10 includes a cover-latch member 51, and base 12 includes a complementary base-latch member 49. As shown, base-latch member 49 is a pair of protrusions that extend outwardly from sidewall 36 of base 12. Also as shown, cover-latch member 51 is a protrusion that extends outwardly (e.g., in the X-Y plane) from cover-sidewall 42 and that defines a pair of holes that are configured to receive the protrusions defined by base-latch member 49.

Cover 14 latches to base 12 when cover-latch member 51 is engaged with base-latch member 49 (e.g., when the protrusions of latch member 49 are inserted into the holes of latch member 51). When engaged, latch members 49 and 51 may prevent cover 14 from detaching from base 12 until, e.g., a user applies sufficient force to overcome the resistance of the latch members. In different examples, different latch members may be used in addition to, or in lieu of, latch members 49 and 51. In one example, a latch member like cover-latch member 51 is included on the base 12, and a latch member like base-latch member 49 is included on the cover 14. Additional examples of latch members may include, but are not limited to, screws, bolts, claps, or the like.

In some situations, it may be useful to lock cover 14 to base 12 in addition to or in lieu of frictionally latching the two components together. Locking cover 14 to base 12 may prevent a passerby from accessing PEIO 16 (FIG. 1) after the PEIO is locked in shelter 10. In the example of FIG. 2, cover 14 is locked to base 12 on one side by hinge 38. On the opposing side of hinge 38, cover 14 includes cover-locking apertures 53A and 53B, and base includes base-locking apertures 55A and 55B. When cover 14 mates with base 12, cover-locking apertures 53A and 53B align with base-locking apertures 55A and 55B to define two locking apertures extending through cover 14 and base 12. A locking member can be inserted through one or both of the locking apertures to lock cover 14 and base 12 together. Example locking members may include padlocks, zip ties, and the like. In this manner, cover 14 can be locked to base 12.

As briefly discussed above with respect to FIG. 1, shelter 10 may include an adjustable first PEIO-cable hole 44A and/or an adjustable second PEIO-cable hole 44B. In some examples, an adjustable cable hole may be adjusted (e.g., by increasing or decreasing the diameter of the cable hole) until there is substantially no separation gap between a PEIO cable and a PEIO cable hole when a PEIO cable is inserted into shelter 10. A smaller separation gap between a PEIO cable and a PEIO-cable hole may decrease the likelihood that unwanted elements (e.g., rain, snow) may enter an interior of shelter 10 through the separation gap.

Figure 3A:
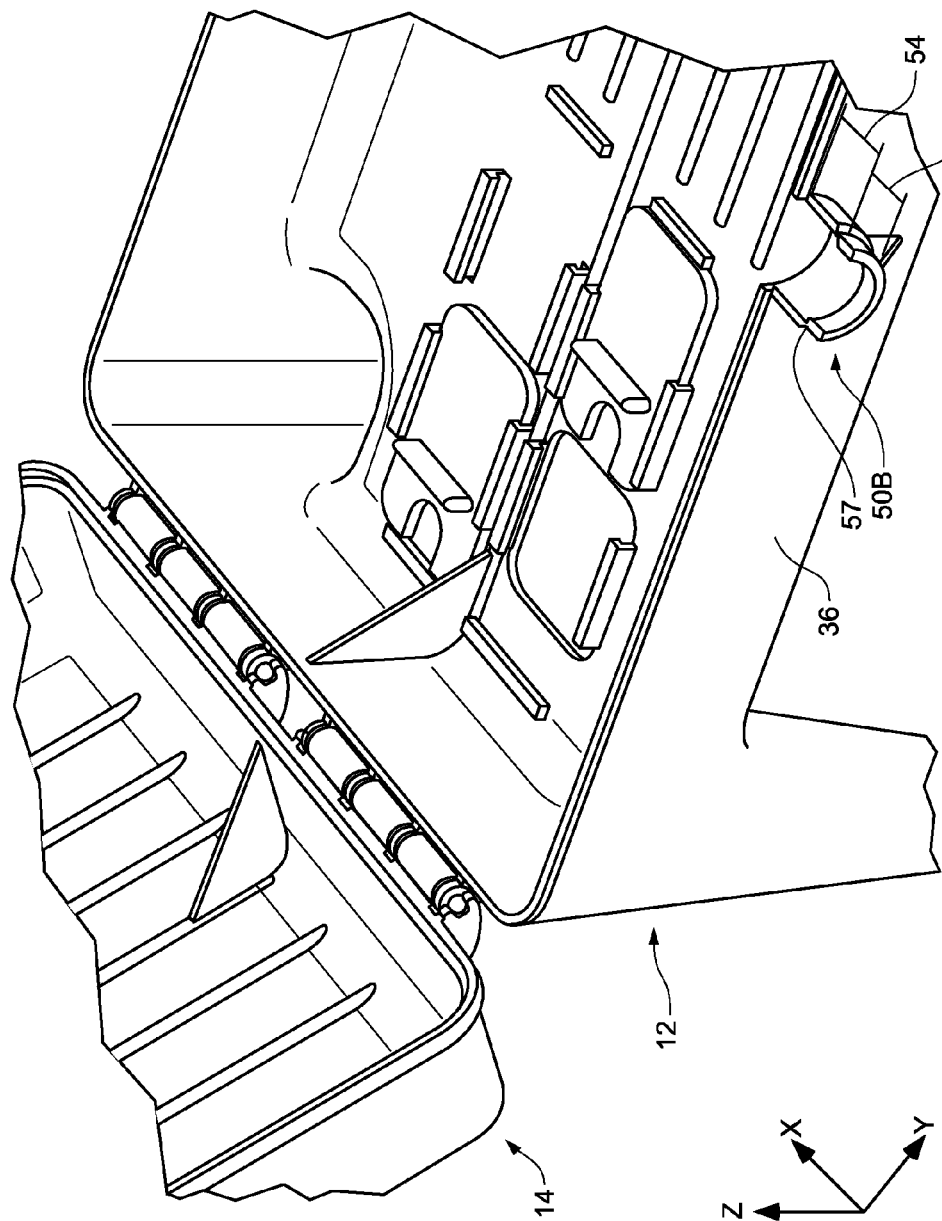
FIGS. 3A and 3B are perspective views of different example portions of the example shelter of FIG. 2.

Shelter 10 can include any suitable feature that is capable of adjusting (e.g., increasing or decreasing) the dimensions of first PEIO-cable hole 44A and/or second PEIO-cable hole 44B. FIG. 3A shows an example of second base-PEIO-cable partial hole 46B, which was described above with respect to FIG. 1. In the example of FIG. 3A, base-PEIO-cable partial-support 50B defines a plurality of different sizes (i.e., diameters) at different distances away from away from sidewall 36 (i.e., in the X-direction). Specifically, base-PEIO-cable partial-support 50B defines a first portion 54 that extends from directly adjacent sidewall 36 to a first distance 57 away from sidewall 36. First portion 54 of base-PEIO-cable partial-support 50B defines a first size. Base-PEIO-cable partial-support 50B also a second portion 52 that extends from first portion 54. Second portion 52 of base-PEIO-cable partial-support 50B defines a second size less than the first size.

Cover-PEIO-cable partial-support 151B (illustrated on FIG. 1) defines a plurality of different complementary sizes (i.e., diameters) at different distances away from cover-sidewall 42, such that different sized PEIO-cable openings are defined at different distances away from cover-sidewall 42. Accordingly, when cover 14 is mated with base 12, cover-PEIO-cable partial-support 151B and base-PEIO-cable partial-support 50B define a first sized opening at a first distance (i.e., in the X-direction) away from shelter 10 and a second sized opening at a second distance (again, in the X-direction) away from shelter 10. The first sized opening is larger than the second sized opening.

In examples in which PEIO 16 includes a comparatively small second PEIO cable 22, the cable can be inserted through the first and second sized openings defined, together, by cover-PEIO-cable partial-support 151B and base-PEIO-cable partial-support 50B so that the separation gap between the cable and the openings is defined as the difference between the cross-sectional size (e.g., in the Y-Z plane) of the cable and the cross-sectional size of the smaller second opening. By contrast, in examples in which PEIO 16 includes a comparatively larger second PEIO cable 22, the portions of cover-PEIO-cable partial-support 151B and base-PEIO-cable partial-support 50B that define the second smaller opening can be removed, e.g., by cutting or breaking the portion, so that the cable opening is defined by the larger first sized opening. In this manner, shelter 10 can be configured with an adjustable PEIO-cable hole.

In some examples, cover-PEIO-cable partial-support 151B and base-PEIO-cable partial-support 50B may include a weakened portion between first portion 54 and second portion 52 (e.g., at weakened portion at distance 57 on FIG. 3A). A weakened portion may allow the second portion of the PEIO-cable hole to fracture from the first portion (e.g., upon application of hand pressure) without substantially affecting the length or diameter of the first portion.

Figure 3B:
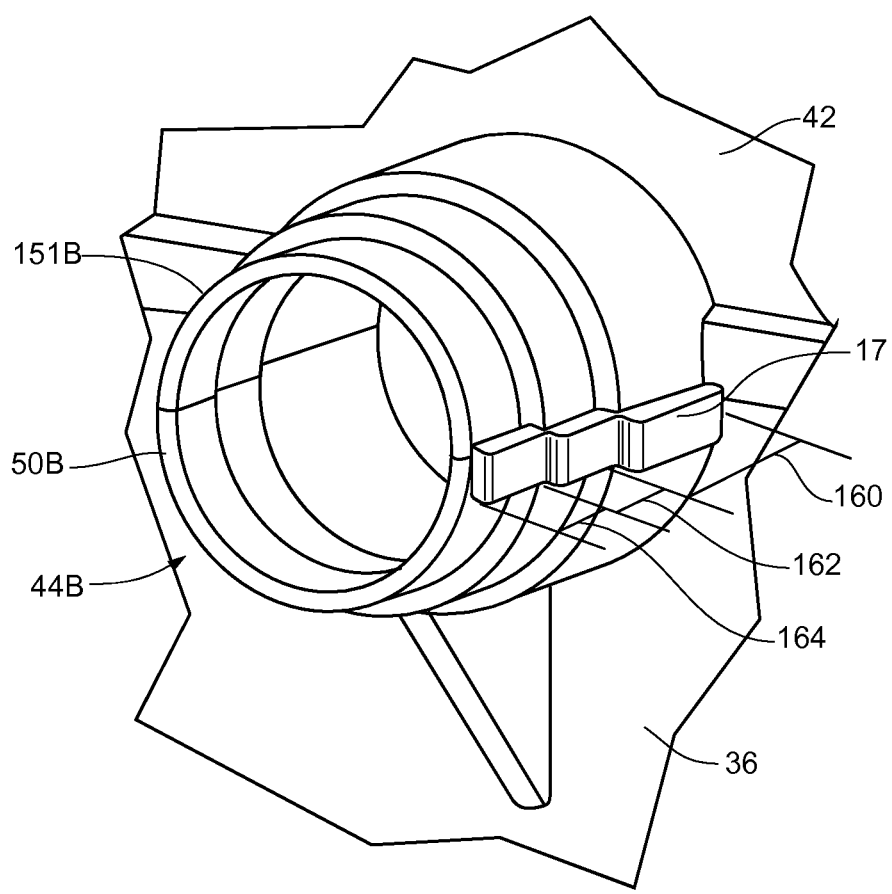

FIG. 3B shows another example of second PEIO-cable hole 44B with adjustable dimensions in accordance with the disclosure. In the example of FIG. 3B, base-PEIO-cable partial-support 50B and cover-PEIO-cable partial-support 151B define a plurality of different sizes (i.e., diameters) at different distances away from away from sidewall 36 and cover-sidewall 42, respectively. Specifically, base-PEIO-cable partial-support 50B and cover-PEIO-cable partial-support 151B each define a first portion 160 that extends from directly adjacent sidewall 36 and cover-sidewall 42, a second portion 162 that extends from first portion 160, and a third portion 164 that extends from second portion 162. First portion 160 defines a first size, second portion 162 defines a second size less than the first size, and third portion 164 defines a third size less than the second size. In use, a cable can be inserted through the first, second, and third sized openings defined by cover-PEIO-cable partial-support 151B and base-PEIO-cable partial-support 50B so that the separation gap between the cable and the openings is defined as the difference between the cross-sectional size of the cable and the cross-sectional size of the smallest (i.e., the third) opening. Alternatively, one or more portion of base-PEIO-cable partial-support 50B and cover-PEIO-cable partial-support 151B can be removed to define larger sized cable openings.

As illustrated in FIG. 3B, cover-PEIO-cable partial-support 151B may include lip 17 (described above with reference to FIG. 1) that extends over base-PEIO-cable partial-support 50B when cover 14 is mated to base 12. Lip 17 may prevent water flowing off of cover 14 from entering shelter 10 at the junction between cover 14 and base 12.

While the forgoing description of FIGS. 3A and 3B of an adjustable PEIO-cable hole was generally described with respect to second PEIO-cable hole 44B, it should be appreciated that PEIO-cable hole 44A of shelter 10, or yet another aperture defined in shelter 10, may be configured with one or more of the described features.

Figure 4A:
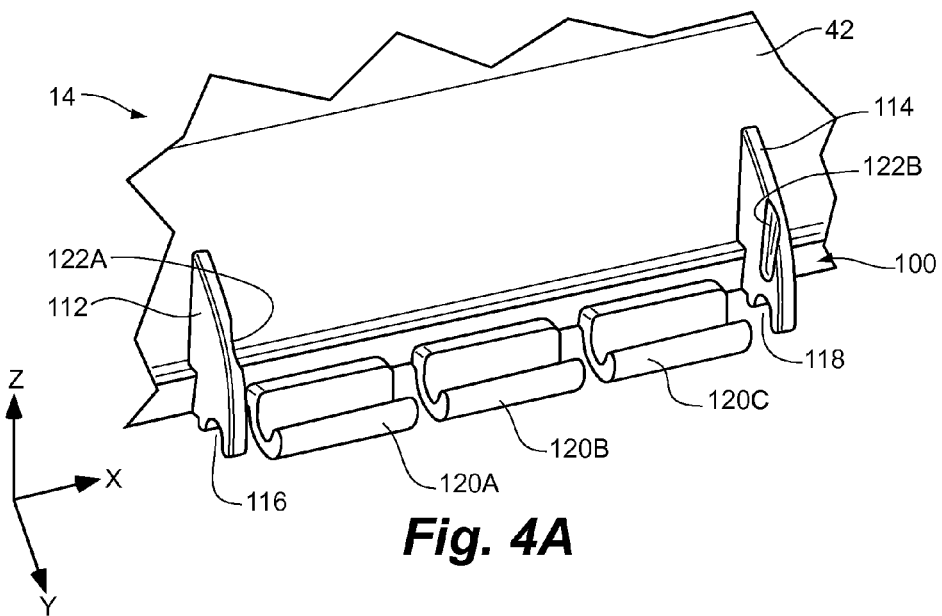
FIGS. 4A and 4B are perspective views of example hinge features that may be used on shelters in accordance with examples of the present disclosure.
Figure 4B:
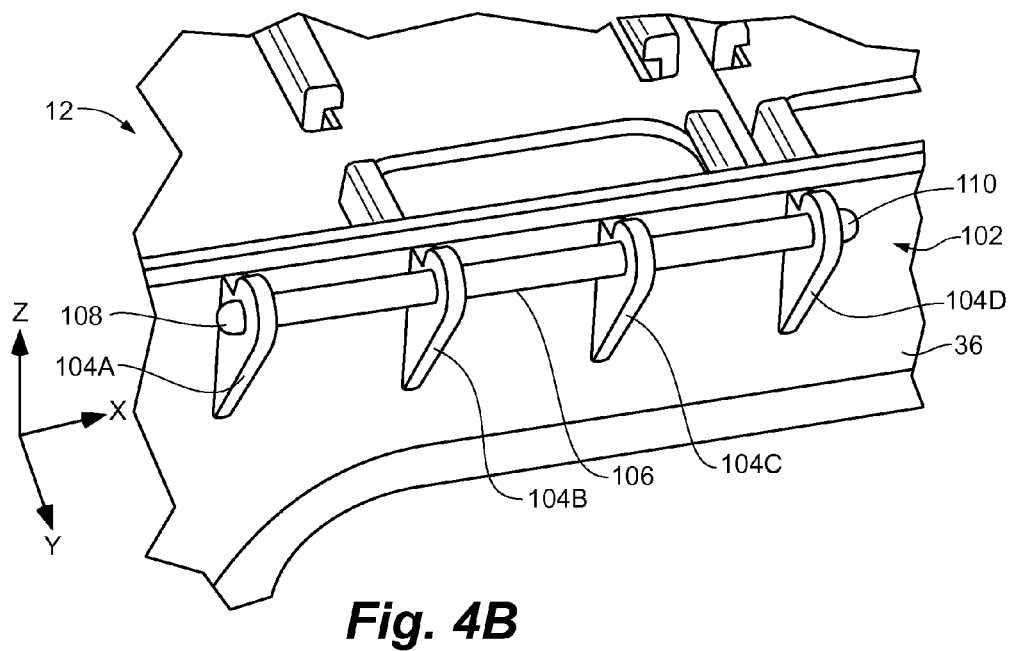
Figure 5:
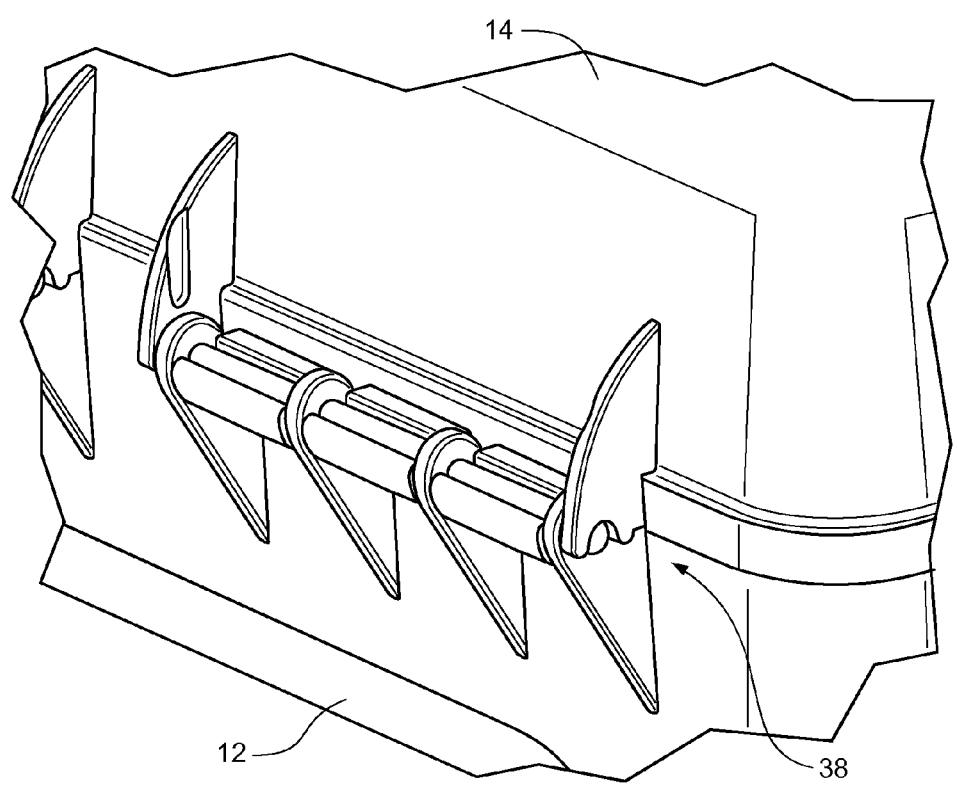
FIG. 5 is a perspective view of an example hinge assembled from the example features of FIGS. 4A and 4B.

As previously described, shelter 10 in the example of FIG. 1 includes hinge 38. Hinge 38 connects base 12 to cover 14 so that cover 14 can pivotally rotate relative to base 12. FIGS. 4A and 4B are exploded views of one example type of hinge that shelter 10 may use. In particular, FIG. 4A is an exploded view of an example hinge section 100 affixed to cover-sidewall 42 of cover 14, while FIG. 4B is an exploded view of corresponding example hinge section 102 affixed to sidewall 36 of base 12. As will be described, hinge section 100 of FIG. 4A is configured to receive hinge section 102 of FIG. 4B to create hinge 38. FIG. 5 is a conceptual illustration of hinge 38 after assembly.

When configured as shown in FIG. 4B, hinge section 102 includes at least one support structure, which in the example of FIG. 4B is illustrated as four support structures 104A-104C (collectively "support structures 104"), that connect hinge pin 106 to sidewall 36 of base 12. Support structures 104 permanently affix hinge pin 106 to sidewall 36 and align hinge pin 106 parallel to sidewall 36. Hinge pin 106 defines a first end projection 108 projecting from support structure 104A (i.e., in the X-direction) and a second end projection 110 projection from support structure 104D (i.e., in the X-direction opposite first end projection 108). Hinge pin 106 and first and second end projections 108 and 110 of hinge pin 106 can be inserted into hinge section 100 (FIG. 4A) to assemble hinge 38.

Hinge section 100 (FIG. 4A) defines at least one hinge pin receptacle for receiving hinge pin 106 during assembly, which, in the example configuration of FIG. 4A, is a plurality of hinge pin receptacles. Hinge section 100 includes a first hinge pin receptacle-support structure 112 and a second hinge pin receptacle-support structure 114. First hinge pin receptacle-support structure 112 defines a first projection receptacle opening 116. Second hinge pin receptacle-support structure 114 defines a second projection receptacle opening 118. Hinge section 100 also includes at least a third hinge pin receptacle interposed between first hinge pin receptacle-support structure 112 and second hinge pin receptacle-support structure 114, which in the example of FIG. 4A is illustrated as three additional hinge pin receptacle-support structures 120A-120C (collectively "support structures 120").

First and second hinge pin receptacle-support structures 112 and 114 extend first and second projection receptacle openings 116 and 118, respectively, away from cover-sidewall 42. Further, first and second hinge pin receptacle-support structures 112 and 114 each orient first and second projection receptacle openings 116 and 118, respectively, in the negative Z-direction indicated on FIG. 4A. First hinge pin receptacle-support structure 112 is configured to receive first end projection 108 of hinge pin 106 (FIG. 4B) during assembly of hinge 38. Second hinge pin receptacle-support structure 114 is configured to receive second end projection 110 of hinge pin 106 (FIG. 4B) during assembly of hinge 38.

Hinge pin receptacle-support structures 120 define receptacle openings that open in the positive Z-direction indicated on FIG. 4A (i.e., in an opposite direction than first and second projection receptacle openings 116 and 118). Hinge pin receptacle-support structures 120 are configured to receive a portion of hinge pin 106 (FIG. 4B) extending between first end projection 108 and second end projection 110 of hinge pin 106 during assembly of hinge 38.

During assembly, hinge section 102 can be inserted in negative Z-direction indicated on FIG. 4A into hinge section 100 to create hinge 38. Specifically, first and second end projections 108 and 110 of hinge pin 106 can be inserted into first and second projection receptacle openings 116 and 118, respectively, while the portion of hinge pin 106 extending between first end projection 108 and second end projection 110 can be inserted into receptacle opening defined by hinge pin receptacle-support structures 120. Because first and second projection receptacle openings 116 and 118 open in one direction while receptacle opening defined by hinge pin receptacle-support structures 120 open in an opposite direction, hinge pin 106 can be supported by opposing forces, which may prevent hinge section 100 from separating from hinge section 102.

Unlike hinge assemblies that require separate parts (e.g., a removable hinge pin) or tools to assemble, the example hinge 38 described with respect to FIGS. 4A and 4B may not require separate parts or tools to assemble. Instead, the pin and receptacle features of hinge 38 are permanently affixed to base 12 and cover 14, respectively, and can be inserted into one another without specialized tools. In applications where shelter 10 is assembled in the field, such an example hinge may save time and expense associated with complicated or laborious assembly.

In some examples, hinge 38 may include one or more features to assist assembly. For instance, in the example of FIG. 4A, first and second hinge pin receptacle-support structures 112 and 114 include assembly guides 122A and 122B, respectively. Assembly guides 122A and 122B define corresponding channels that taper (e.g., in the X and/or Y-directions) in the negative Z-direction. First and second end projections 108 and 110 of hinge pin 106 (FIG. 4B) can be inserted into assembly guides 122A and 122B, respectively, during assembly of hinge 38. As first and second end projections 108 and 110 are pressed in the negative Z-direction, the tapering on assembly guides 122A and 122 may cause first and second hinge pin receptacle-support structures 112 and 114 to be displaced in opposing directions (i.e., in opposing X-directions). In this manner, first and second end projections 108 and 110 can be inserted between first and second hinge pin receptacle-support structures 112 and 114 and into first and second projection receptacle openings 116 and 118, respectively.

While hinge 38 was described as being configured with hinge section 100 affixed to cover-sidewall 42 of cover 14 and hinge section 102 affixed to sidewall 36 of base 12, it should be appreciated that in other examples, hinge section 100 can be affixed to sidewall 36 of base 12 and hinge section 102 can be affixed to cover-sidewall 42 of cover 14. Other configurations and arrangements of the various features of hinge 38 are contemplated.

In some examples, hinge 38 is configured so that cover 14 can pivotally rotate at least 180 degrees relative to base 12 between an open position and a closed position. Such a configuration may provide ready access to platform 34 of base 12, e.g., for inserting and removing PEIO 16 from shelter 10.

A shelter in accordance with the disclosure can assume a variety of different configurations, as described above. In some examples, a shelter according to the disclosure may be configured to be stacked in a nested arrangement with a plurality of similarly configured shelters. When configured to be stacked in a nested arrangement, multiple shelters may be stored and/or transported within a confined space.

Figure 6:
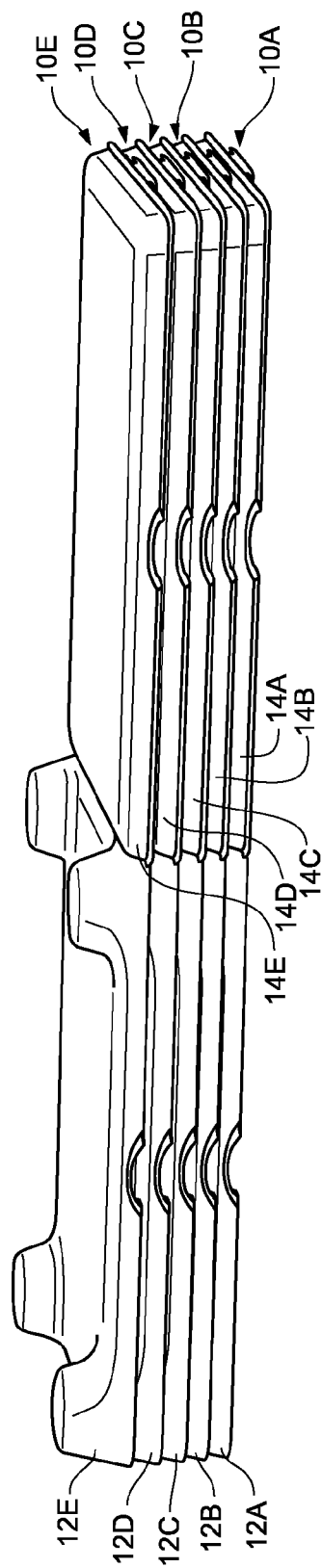
FIG. 6 is a perspective view of multiple shelters in a stacked arrangement in accordance with examples of the present disclosure.

FIG. 6 is a conceptual drawing of an example stacked arrangement for shelters 10A-10E. Each shelter of shelters 10A-10E may define the configuration of shelter 10, described above with respect to FIGS. 1-5. As seen in the example of FIG. 6, covers 14A-14E of shelters 10A-10E are rotated open approximately 180 degrees relative to bases 12A-12E. Further the base of one shelter (e.g., 12A) is inserted into the base of another shelter (e.g., 12B), while the cover of one shelter (e.g., 14A) is inserted into the cover of another shelter (e.g., 14B). In this manner, each shelter of shelters 10A-10E is stacked on top of one another to define a nested stack of shelters. In some examples, this configuration of shelters may allow multiple shelters to be stored and/or transported within a confined space.

Figure 7:
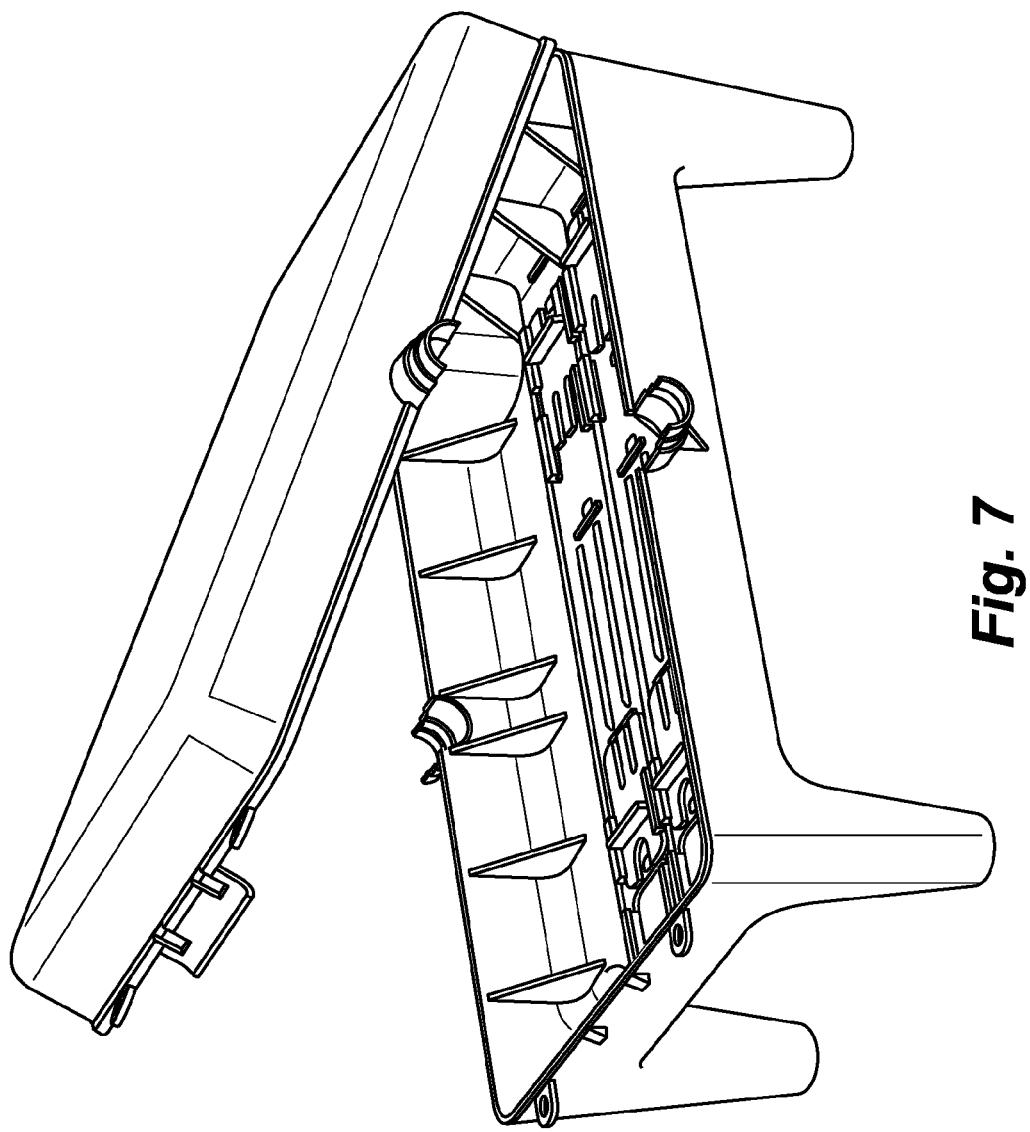
FIG. 7 is perspective view of an example of the shelter of FIG. 1 without the portable electrical inlet/outlet.
Figure 8:
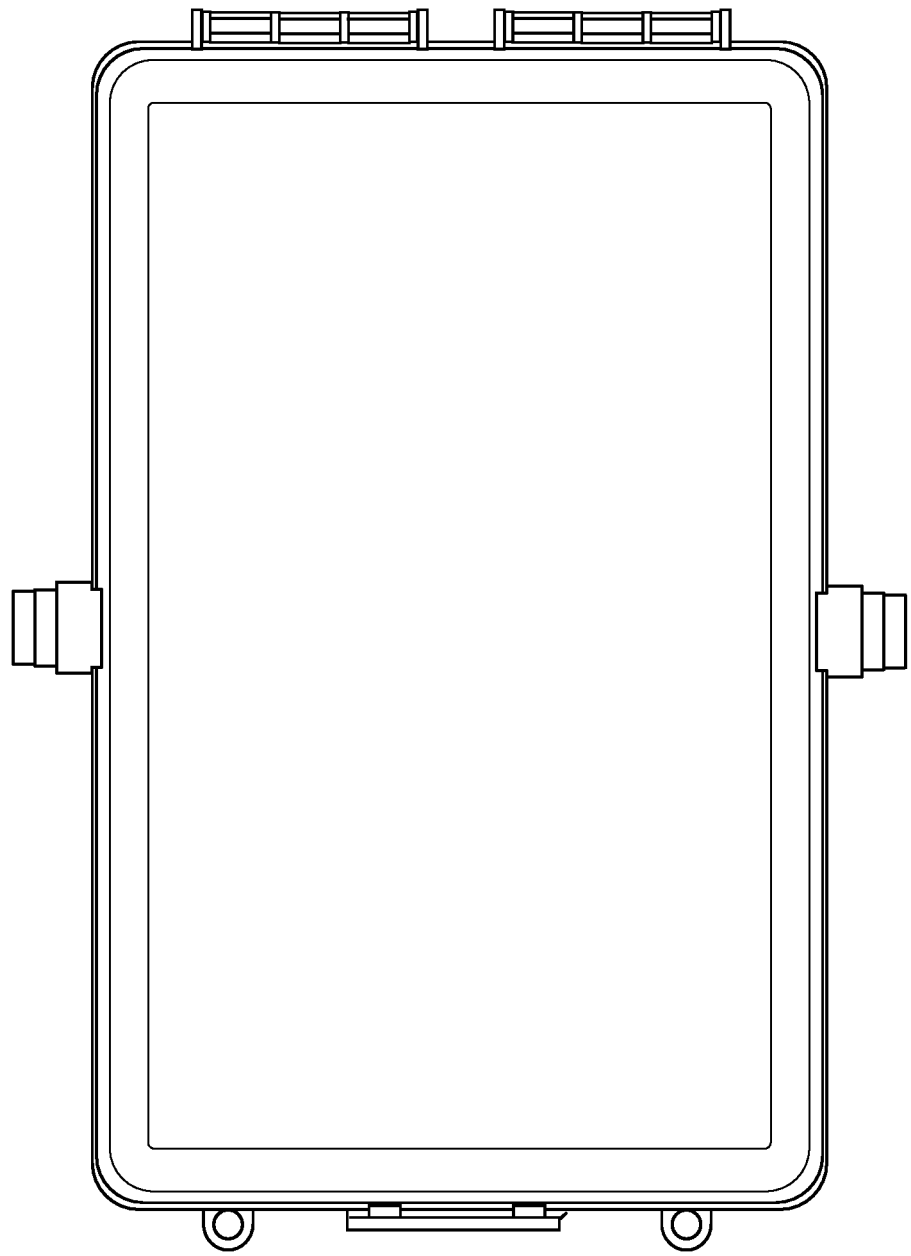
FIG. 8 is a perspective top view of the example shelter of FIG. 7.
Figure 9:
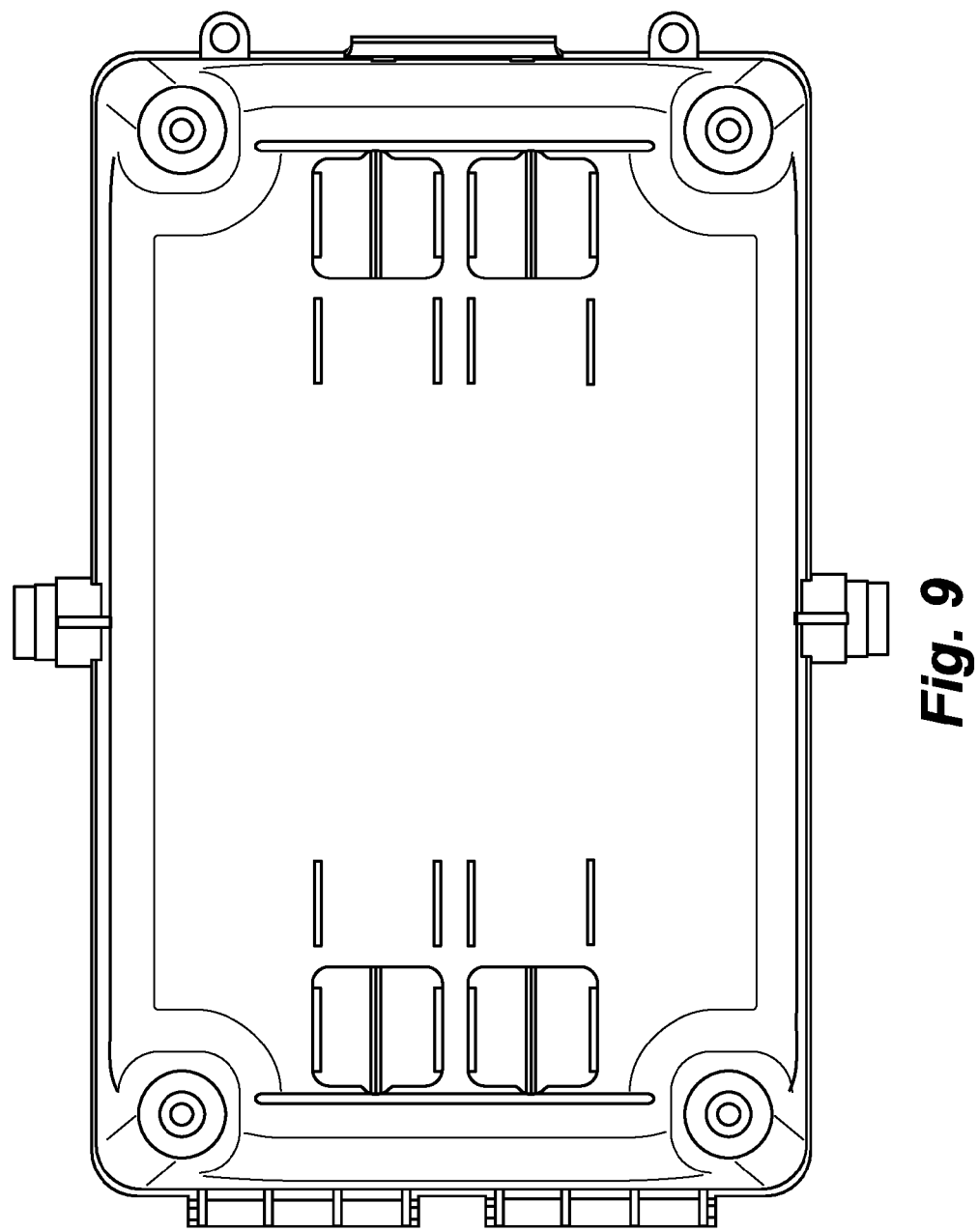
FIG. 9 is a perspective bottom view of the example shelter of FIG. 7.
Figure 10:
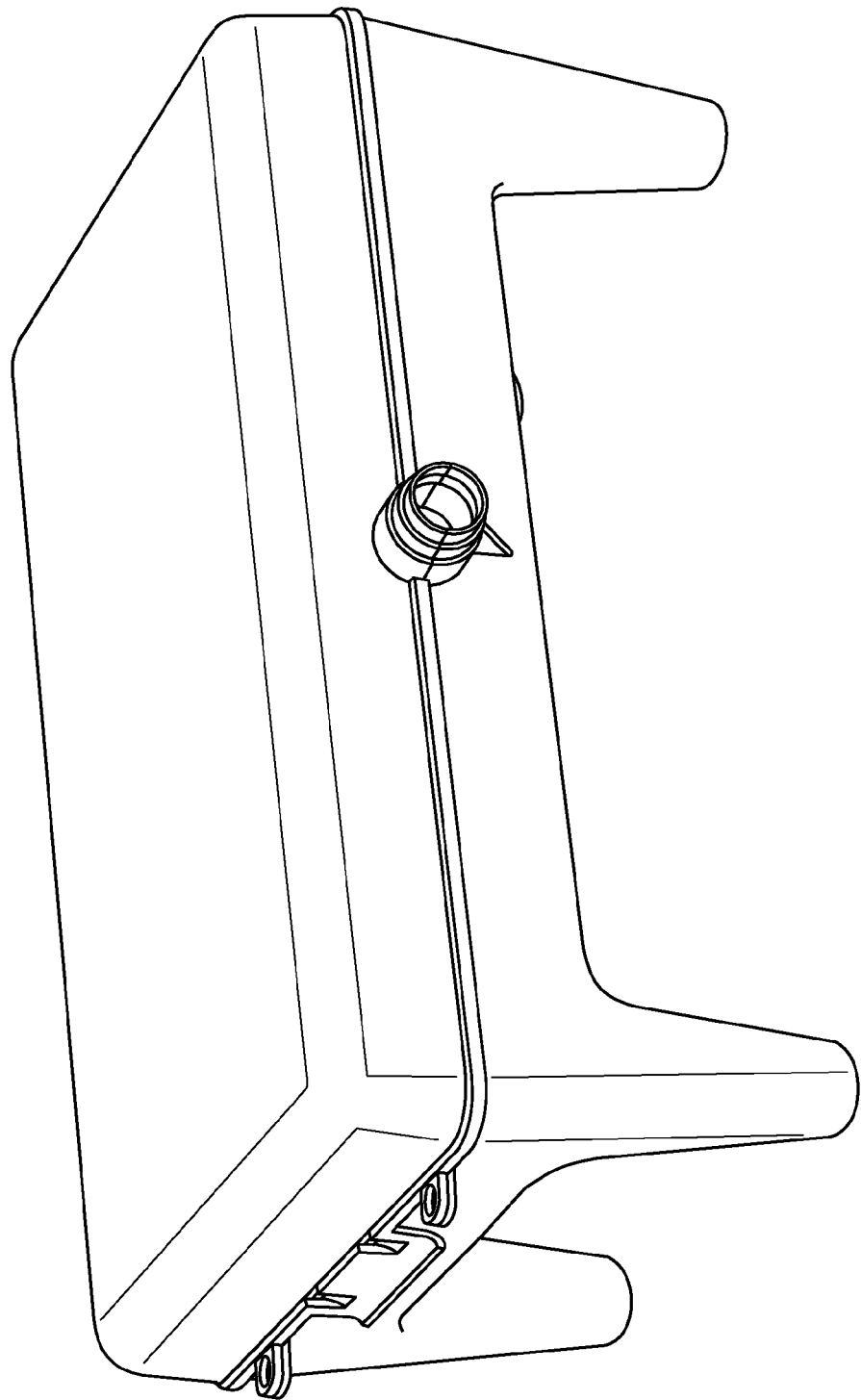
FIG. 10 is a perspective side view of the example shelter of FIG. 7.
Figure 11:
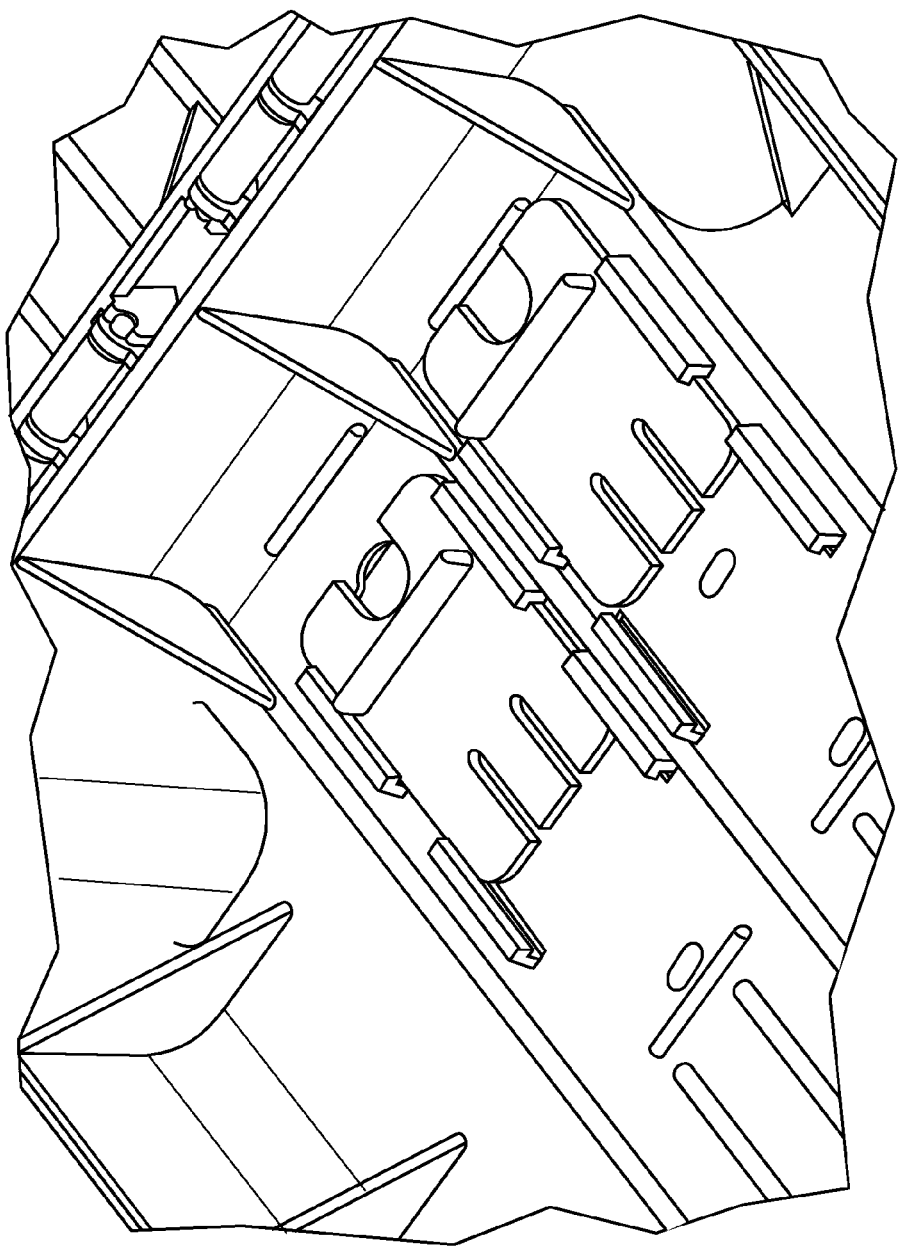
FIG. 11 is a perspective view of an example portion of the example shelter of FIG. 7.
Figure 12:
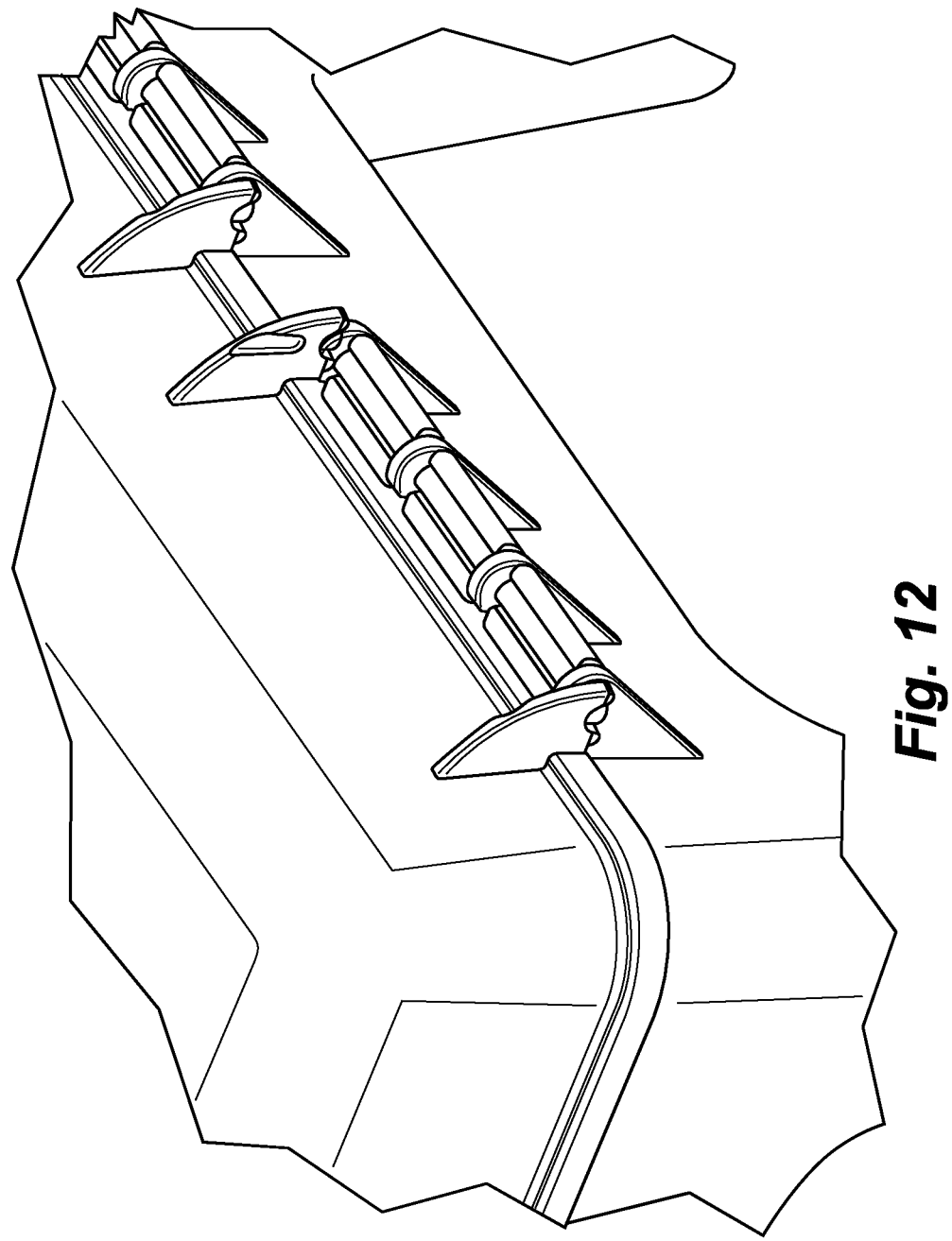
FIG. 12 is a perspective view of an example hinge on the example shelter of FIG. 7.
Figure 13:
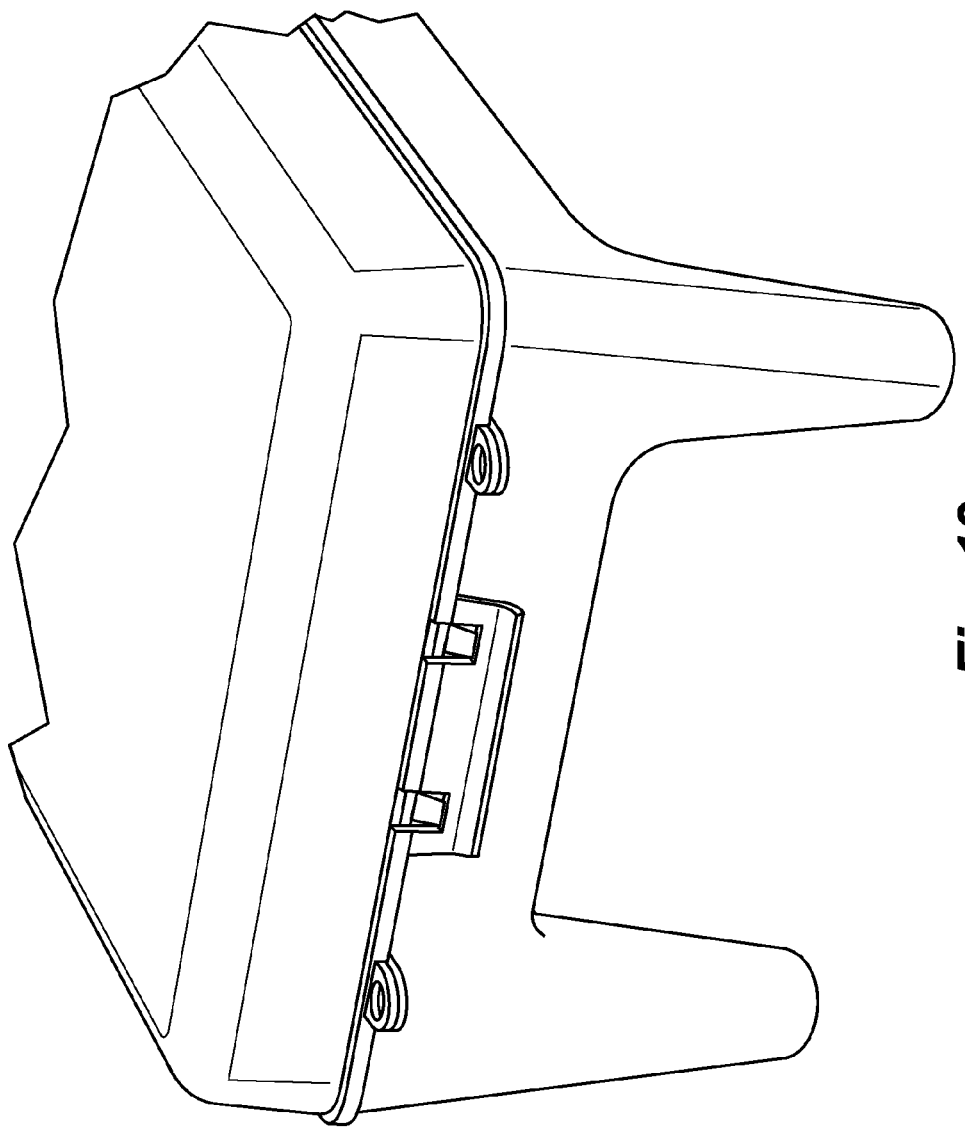
FIG. 13 is another perspective side view of the example shelter of FIG. 7.

FIGS. 7-13 illustrate several different views of an example shelter that includes features illustrated and described with respect to shelter 10 above. FIG. 7 is perspective view of the example shelter. FIG. 8 is a perspective top view of the example shelter of FIG. 7. FIG. 9 is a perspective bottom view of the example shelter of FIG. 7. FIG. 10 is a perspective side view of the example shelter of FIG. 7. FIG. 11 is a perspective view of an example portion of the example shelter of FIG. 7. FIG. 12 is a perspective view of an example hinge on the example shelter of FIG. 7. FIG. 13 is another perspective side view of the example shelter of FIG. 7.

In the foregoing detailed description, the invention has been described with reference to specific examples. However, it may be appreciated that various modifications and changes can be made without departing from the scope of the invention as set forth in the appended claims. Thus, some of the features of preferred embodiments described herein are not necessarily included in preferred embodiments of the invention which are intended for alternative uses.

What is claimed is:

1. A shelter for protecting a portable electrical inlet/outlet (PEIO) from unwanted elements, the PEIO including a PEIO body, first and second PEIO cables, and at least two PEIO-component connectors, the shelter comprising:
    (a) a base that includes
        (i) a platform to support the PEIO body, the platform including a main area and a raised rib structure configured to segregate the PEIO body from water that may accumulate in the main area, and
        (ii) at least one sidewall extending substantially around at least a portion of a perimeter of the platform; and
    (b) a cover configured to mate with the base to substantially enclose the platform,
    wherein the shelter defines at least two PEIO-component-connector-cable holes configured to permit component cables to extend from an exterior of the shelter to the at least two PEIO-component connectors within the shelter, and
    wherein the shelter defines a first PEIO-cable hole and a second PEIO-cable hole, the first and second PEIO-cable holes being configured to permit the first and second PEIO cables to extend from the PEIO body within the shelter to an exterior of the shelter.

2. The shelter of claim 1, wherein the base further defines a drain aperture, and at least a portion of the main area of the platform is sloped toward the drain aperture to drain water that may accumulate in the main area out of the base.

3. The shelter of claim 1, wherein the base further comprises at least one elevating portion extending downwardly from the platform, the at least one elevating portion configured to elevate the platform and maintain the platform in a generally parallel relationship with a surface on which the shelter is set.

4. The shelter of claim 3, wherein the at least one elevating portion comprises at least four legs extending downwardly from the platform.

5. The shelter of claim 3, wherein the at least one elevating portion is configured to elevate the platform at least 3 inches above the surface on which the shelter is set.

6. The shelter of claim 1, wherein the main area of the platform defines the at least two PEIO-component-connector-cable holes.

7. The shelter of claim 6, wherein the main area of the platform defines a first portion, and a second portion separated from the first portion by the raised rib structure, and wherein the main area of the platform defines at least four PEIO-component-connector-cable holes, at least two PEIO-component-connector-cable holes defined in the first portion of the main area, and at least two different PEIO-component-connector-cable holes defined in the second portion of the main area of the platform.

8. The shelter of claim 6, further comprising a plurality of PEIO-component-connector-cable-hole covers, wherein a separate one of the plurality of PEIO-component-connector-cable-hole covers is configured to cover at least a portion of each of the at least two PEIO-component-connector-cable holes.

9. The shelter of claim 8, wherein each of the plurality of PEIO-component-connector-cable-hole covers is configured to slide between a first position in which a PEIO-component-connector-cable hole is open for receiving a component cable and a second position in which the PEIO-component-connector-cable hole is substantially closed.

10. The shelter of claim 1, wherein the cover is hingedly mounted to the base.

11. The shelter of claim 10, wherein the cover is configured to pivotally rotate at least 180 degrees between a closed position and an open position.

12. The shelter of claim 1, wherein the at least one sidewall of the base comprises at least four base-sidewalls extending upwardly, with a first base-PEIO-cable partial-hole being defined in a first base-sidewall, and a second base-PEIO-cable partial-hole being defined in an opposed second base-sidewall, and wherein the cover comprises at least four cover-sidewalls extending downwardly, with a first cover-PEIO-cable partial-hole being defined in a first cover-sidewall, and a second cover-PEIO-cable partial-hole being defined in an opposed second cover-sidewall, wherein when the cover mates with the base, the first cover-PEIO-cable partial-hole aligns with the first base-PEIO-cable partial-hole to create the first PEIO-cable hole and the second cover-PEIO-cable partial-hole aligns with the second base-PEIO-cable partial-hole to create the second PEIO-cable hole.

13. The shelter of claim 12, wherein the base further comprises a hinge pin permanently affixed to a base-sidewall and extending parallel to the base-sidewall, and the cover further comprises a hinge pin receptacle permanently affixed to a cover-sidewall and extending parallel to the cover-sidewall, wherein the hinge pin receptacle is configured to receive the hinge pin to define a hinged connection between the cover and the base.

14. The shelter of claim 13, wherein the hinge pin extends from a first end to a second end opposite the first end, the first end projecting from a first hinge-pin-support structure connecting the hinge pin to the base-sidewall, and the second end projecting from a second hinge-pin-support structure connecting the hinge pin to the base-sidewall, and wherein the hinge pin receptacle of the cover comprises a first receptacle-support structure defining a first projection receptacle opening in a first direction, a second receptacle-support structure defining a second projection receptacle opening in the first direction, and a third receptacle-support structure defining a third receptacle opening in a second direction opposite the first direction, wherein the first projection receptacle opening is configured to receive the first end of the hinge pin, the second projection receptacle opening is configured to receive the second end of the hinge pin, and the third receptacle opening is configured to receive a portion of the hinge pin extending between the first end of the hinge pin and the second end of the hinge pin.

15. The shelter of claim 14, wherein the first receptacle-support structure defines a first channel configured to receive the first end of the hinge pin during assembly of the hinged connection, the second receptacle-support structure defines a second channel configured to receive the second end of the hinge pin during assembly of the hinged connection, and the first channel and the second channel are each tapered such that the first receptacle-support structure and the second receptacle-support structure are displaced in opposing directions during assembly of the hinged connection.

16. The shelter of claim 1, wherein the cover further comprises a latching member configured to frictionally engage with at least a portion of the base, wherein the latching member is configured to substantially resist separation between the cover and the base when the cover is mated with the base.

17. The shelter of claim 1, wherein the base defines a first locking aperture extending through the base, and the cover defines a second locking aperture extending through the cover, wherein the first locking aperture is positioned to align with the second locking aperture when the cover is mated with the base so as to define a locking aperture extending through the cover and the base that is configured to receive a locking member to lock the cover to the base.

18. The shelter of claim 1, wherein the base further comprises a first PEIO-cable support surface extending substantially orthogonally from the at least one sidewall of the base, and a second PEIO-cable support surface extending substantially orthogonally from the at least one sidewall of the base in an opposing direction from the first PEIO-cable support surface.

19. The shelter of claim 18, at least one of the first PEIO-cable support surface or the second PEIO-cable support surface defines a first diameter a first distance from the PEIO body, and a second diameter less than the first diameter at a second distance from the PEIO body greater than the first distance.

20. The shelter of claim 19, wherein the at least one of the first PEIO-cable support surface or the second PEIO-cable support surface defines a first portion that defines the first diameter and a second portion that defines the second diameter, and wherein the second portion is configured to fracture from the first portion upon application of a force without substantially affecting a length or a diameter of the first portion.

21. A system comprising:
(a) a portable electrical inlet/outlet (PEIO) that includes a PEIO body, a first PEIO cable, a second PEIO cable, and at least two PEIO-component connectors;
(b) a shelter comprising:
(i) a base that includes
(A) a platform to support the PEIO body, the platform including a main area and a raised rib structure configured to segregate the PEIO body from water that may accumulate in the main area, and
(B) at least one sidewall extending substantially around at least a portion of a perimeter of the platform; and
(ii) a cover configured to mate with the base to substantially enclose the platform,
wherein the shelter defines a first PEIO-cable hole, a second PEIO-cable hole, and at least two PEIO-component-connector-cable holes; and
(c) a component cable,
wherein the PEIO is positioned such that the PEIO body is adjacent the raised rib structure of the shelter, the first PEIO cable extends from the PEIO body through the first PEIO-cable hole to an exterior of the shelter, the second PEIO cable extends from the PEIO body through the second PEIO-cable hole to the exterior of the shelter, and the component cable extends from one of the at least two PEIO-component connectors through one of the at least two PEIO-component-connector-cable holes to the exterior of the shelter.

22. The system of claim 21, wherein the shelter further comprises at least one elevating portion extending downwardly from the platform, the at least one elevating portion configured to elevate the platform and maintain the platform in a generally parallel relationship with a surface on which the shelter is set.

23. The system of claim 21, wherein the at least one sidewall of the base comprises at least four base-sidewalls extending upwardly, with a first base-PEIO-cable partial-hole being defined in a first base-sidewall, and a second base-PEIO-cable partial-hole being defined in an opposed second base-sidewall, and wherein the cover comprises at least four cover-sidewalls extending downwardly, with a first cover-PEIO-cable partial-hole being defined in a first cover-sidewall, and a second cover-PEIO-cable partial-hole being defined in an opposed second cover-sidewall, wherein when the cover mates with the base, the first cover-PEIO-cable partial-hole aligns with the first base-PEIO-cable partial-hole to create the first PEIO-cable hole and the second cover-PEIO-cable partial-hole aligns with the second base-PEIO-cable partial-hole to create the second PEIO-cable hole.

24. A method comprising:
(a) providing a shelter that includes:
(i) a base comprising (A) a platform having a main area and a raised rib structure and (B) at least one sidewall extending substantially around at least a portion of a perimeter of the platform; and
(ii) a cover,
wherein the shelter defines a first PEIO-cable hole, a second PEIO-cable hole, and at least two PEIO-component-connector-cable holes;
(b) providing a portable electrical inlet/outlet (PEIO) that includes a PEIO body, a first PEIO cable, a second PEIO cable, and at least two PEIO-component connectors;
(c) inserting the PEIO into the shelter, which includes:
(i) placing the PEIO body on the raised rib structure to segregate the PEIO body from water that may accumulate in the main area,
(ii) positioning the first PEIO cable in the shelter's first PEIO-cable hole, and
(iii) positioning the second PEIO cable in the shelter's second PEIO-cable hole; and
(d) mating the shelter's cover to the shelter's base to substantially enclose the PEIO body within the shelter.

25. The method of claim 24, further comprising (e) extending a component cable from the exterior of the shelter through one of the at least two PEIO-component-connector-cable holes of the shelter and connecting the component cable to one of the at least two PEIO-component connectors.

26. The method of claim 25, wherein the shelter further comprises at least one PEIO-component-connector-cable-hole cover, and wherein extending the component cable from the exterior of the shelter through one of the at least two PEIO-component-connector-cable holes of the shelter and connecting the component cable to one of the at least two PEIO-component connectors comprises sliding the at least one PEIO-component-connector-cable-hole cover to a first position to open a PEIO-component-connector-cable hole, inserting the component cable through the opened PEIO-component-connector-cable hole, and sliding the at least one PEIO-component-connector-cable-hole cover to a second position to substantially close the at least one PEIO-component-connector-cable-hole cover around the component cable.

27. The method of claim 24, wherein the shelter further comprises at least one PEIO-cable support surface extending substantially orthogonally from at least one of the cover or the at least one sidewall of the base, the at least one PEIO-cable support surface defining a first portion that defines a first diameter a first distance from the PEIO body, and a second portion that defines a second diameter less than the first diameter at a second distance from the PEIO body greater than the first distance, the method further comprising fracturing the second portion from the first portion.

28. The method of claim 24, wherein the shelter further comprises at least one elevating portion extending downwardly from the platform, the at least one elevating portion configured to elevate the platform and maintain the platform in a generally parallel relationship with a surface on which the shelter is set.

* * * * *